United States Patent
Rohde et al.

(10) Patent No.: US 7,365,612 B2
(45) Date of Patent: Apr. 29, 2008

(54) LOW NOISE, HYBRID TUNED WIDEBAND VOLTAGE CONTROLLED OSCILLATOR

(75) Inventors: Ulrich L. Rohde, Upper Saddle River, NJ (US); Ajay Kumar Poddar, Fairlawn, NJ (US); Reimund Rebel, Ringwood, NJ (US); Parimal Patel, Jersey City, NJ (US); Klaus Juergen Schoepf, Ringwood, NJ (US)

(73) Assignee: Synergy Microwave Corporation, Patersor, NJ (US)

( * ) Notice: Subject to any disclaimer, the term of this patent is extended or adjusted under 35 U.S.C. 154(b) by 62 days.

(21) Appl. No.: 11/204,702

(22) Filed: Aug. 16, 2005

(65) Prior Publication Data
US 2006/0033586 A1    Feb. 16, 2006

Related U.S. Application Data

(60) Provisional application No. 60/601,823, filed on Aug. 16, 2004.

(51) Int. Cl.
*H01L 23/66* (2006.01)
*H03B 5/18* (2006.01)
*H03B 9/14* (2006.01)

(52) U.S. Cl. ............... 331/107 SL; 331/107 P; 331/177 R

(58) Field of Classification Search .......... 331/107 SL, 331/107 DP, 107 C, 107 P, 132, 185, 108 R, 331/117 R, 114, 115; 333/238, 246
See application file for complete search history.

(56) References Cited

U.S. PATENT DOCUMENTS

| | | | |
|---|---|---|---|
| 2,502,488 A | 4/1950 | Shockley | |
| 2,524,035 A | 10/1950 | Bardeen et al. | |
| 3,373,379 A | 3/1968 | Black | |
| 4,310,809 A * | 1/1982 | Buck et al. | ............. 331/117 D |
| 4,338,576 A * | 7/1982 | Takahashi et al. | ............ 331/67 |
| 4,435,688 A | 3/1984 | Shinkawa et al. | |
| 4,527,130 A | 7/1985 | Lutteke | |
| 4,619,001 A | 10/1986 | Kane | |
| 4,621,241 A | 11/1986 | Kiser | |

(Continued)

FOREIGN PATENT DOCUMENTS

| | | |
|---|---|---|
| DE | 3443446 A | 5/1986 |
| EP | 0 475 262 A | 3/1992 |
| EP | 0 800 224 A | 10/1997 |
| EP | 0 823 777 | 2/1998 |
| EP | 0 843 374 A | 5/1998 |

(Continued)

OTHER PUBLICATIONS

D. Ham, A. Hajimiri, "Concepts and Methods in Optimization of Integrated LCVCOs," IEEE Journal of Solid-state Circuits, Jun. 2001.

(Continued)

*Primary Examiner*—Benny Lee
*Assistant Examiner*—Ryan J Johnson
(74) *Attorney, Agent, or Firm*—Lerner, David, Littenberg, Krumholz & Mentlik, LLP

(57) ABSTRACT

An oscillator comprising an active device having first, second and third terminals, a plurality of micro-stripline resonators coupled together to form a coupled-resonator network, the coupled-resonator network being coupled to the second terminal of the active device and a tuning network coupled to the coupled-resonator network, the tuning network being operable to adjust the coupling between at least two of the resonators that form the coupled resonator network.

28 Claims, 12 Drawing Sheets

U.S. PATENT DOCUMENTS

| | | | |
|---|---|---|---|
| 4,633,197 | A | 12/1986 | Vanderspool, II |
| 4,677,396 | A * | 6/1987 | Cruz et al. ............... 331/117 R |
| 4,692,714 | A | 9/1987 | Galani |
| 4,812,784 | A | 3/1989 | Chung et al. |
| 4,868,526 | A | 9/1989 | Camiade |
| 5,041,799 | A | 8/1991 | Pirez |
| 5,053,649 | A * | 10/1991 | Johnson ......................... 327/3 |
| 5,142,255 | A | 8/1992 | Chang et al. |
| 5,187,451 | A * | 2/1993 | Nakamoto et al. ............ 331/99 |
| 5,231,361 | A | 7/1993 | Smith et al. |
| 5,363,067 | A * | 11/1994 | Crandall et al. ....... 331/107 SL |
| 5,373,264 | A | 12/1994 | Higgins |
| 5,402,087 | A | 3/1995 | Gorczak |
| 5,434,542 | A | 7/1995 | Veith et al. |
| 5,650,754 | A | 7/1997 | Joshi |
| 5,661,439 | A | 8/1997 | Watkins et al. |
| 5,748,051 | A | 5/1998 | Lewis |
| 5,821,410 | A * | 10/1998 | Xiang et al. .................. 73/105 |
| 5,854,578 | A | 12/1998 | Minasi et al. |
| 5,856,763 | A | 1/1999 | Reeser et al. |
| 5,900,788 | A | 5/1999 | Hagemeyer et al. |
| 5,936,480 | A | 8/1999 | Chong et al. |
| 6,124,767 | A | 9/2000 | Woods |
| 6,297,708 | B1 | 10/2001 | Lemay |
| 6,326,854 | B1 | 12/2001 | Nicholls et al. |
| 6,486,744 | B1 * | 11/2002 | Cann ...................... 331/117 D |
| 6,489,853 | B1 | 12/2002 | Lewis |
| 6,501,341 | B2 * | 12/2002 | Mashimo ..................... 331/96 |
| 6,624,726 | B2 | 9/2003 | Niu |
| 6,630,869 | B2 | 10/2003 | Flynn et al. |
| 6,714,088 | B2 | 3/2004 | Chang |
| 6,714,772 | B2 | 3/2004 | Kasahara et al. |
| 6,731,181 | B2 | 5/2004 | Fukayama et al. |
| 6,734,745 | B2 | 5/2004 | Sakai |
| 6,737,928 | B2 | 5/2004 | Kubo et al. |
| 2001/0004225 | A1 | 6/2001 | Nicholls et al. |
| 2001/0030583 | A1 | 10/2001 | Ikarashi |
| 2001/0035794 | A1 | 11/2001 | Fujidai et al. |
| 2002/0084860 | A1 | 7/2002 | Festag et al. |
| 2003/0160660 | A1 | 8/2003 | Chang et al. |
| 2004/0095197 | A1 | 5/2004 | Wang et al. |
| 2004/0130402 | A1 | 7/2004 | Marquardt |
| 2005/0156683 | A1 | 7/2005 | Rohde et al. |
| 2005/0280478 | A1 * | 12/2005 | Patel et al. ............ 331/107 SL |

FOREIGN PATENT DOCUMENTS

| | | |
|---|---|---|
| EP | 1 093 216 A | 4/2001 |
| JP | 59-072205 A | 4/1984 |
| JP | 59-139708 A | 8/1984 |
| WO | WO-02/17476 A | 2/2002 |
| WO | WO-02/005416 A1 | 11/2002 |

OTHER PUBLICATIONS

E. Hegazi, H. Sjoland, and A. Abidi, "A Filtering Technique to Lower LC Oscillator Phase Noise," IEEE J. Solid-State Circuits, vol. 36, pp. 1921-1929, Dec. 2001.

J. C. Nallatamby, M. Prigent, M. Camiade, J. Obregon, "Phase Noise in Oscillators-Leeson Formula Revisited," IEEE Transactions on Microwave Theory and Techniques, vol. 51, No. 4, pp. 1386-1394, Apr. 2003.

U.L. Rohde, "A Novel RFIC for UHF Oscillators (Invited)," 2000 IEEE Radio Frequency Integrated Circuits (RFIC) Symposium, Boston, MA, Jun. 11-13, 2000.

M. Odyniec, Editor, RF and Microwave Oscillator Design, Chapter 3: Linearity, Time Variation, and Oscillator Phase Noise, by T. Lee and A. Hajimiri, Artech House, 2002.

M. Vidmar, "A Wideband, Varactor-Tuned Microstrip VCO," Microwave Journal, Jun. 1999.

H.C. Chang,"Phase noise self-injection-locked oscillators- Theory and experiment,"IEEE Transactions on Microwave Theory and Techniques, vol. 51, No. 9, pp. 1994-1999, Sep. 2003.

Franz X. Sinnesbichler, "Hybrid Millimeter-Wave Push-Push Oscillators using Silicon-Germanium HBTs,"IEEE MTT-S, vol. 51, Feb. 2003.

U.L. Rohde, D.P. Newkirk, RF/Microwave Circuit Design for Wireless Applications, pp. (123-197; Chapter 5), John Wiley & Sons, Apr. 2000, ISBN 0-471-29818-2.

Douglas R. Jachowski, "Passive Enhancement of Resonator Q in Microwave Notch Filters", IEEE MTT-S Digest, pp. 1315-1318, Jun. 2004.

A. K. Poddar, S.K. Koul, and B. Bhat, "Millimeter Wave Evanescent Mode Gunn Diode Oscillator in Suspended Stripline Configuration." 22nd international Conference on Millimeter Waves, pp. 265-266, Jul. 1997.

Henkes, Dale D, 'Designing Short High Q Resonators', Design, Dec. 2003, pp. 75-109.

Ulrich Rohde, "A New and Efficient Method of Designing Low Noise Microwave Oscillators," PhD Dissertation, Technical University of Berlin, 2004.

A. K. Poddar and K. N. Pandey, "Microwave Switch using MEMS technology,"8th IEEE International Symposium, EDMO-2000, pp. 134-139, Nov. 2000, UK.

A. M. Elsayed and M. I. Elmasry, "Low-Phase-Noise LC Quadrature VCO using Coupled Tank Resonators in Ring," IEEE, JSSC, vol. 36, pp. 701-705, Apr. 2001.

A. Ward and B. Ward, "A Comparison of various Bipolar Transistor Biasing Circuits," Applied Microwave & Wirelesss, vol. 13, pp. 30-52, 2001.

A.V. Grebennikov, "Microwave Transistor Oscillators: an Analytic Approach to Simplify Computer-Aided Design", Microwave Journal, pp. 294-299, May1999.

Amir Mortazawi, Heinrich D. Foltz, and Tatsuo Itoh, "A Periodic Second Harmonic Spatial Power Combining Oscillator", IEEE, MTT, vol. 40, pp. 851-856, May 1992.

Andrea Borgioli, Pochi Yeh, and Robert A. York, "Analysis of Oscillators with External Feedback Loop for Improved Locking Range and Noise Reduction," IEEE Trans. MTT, vol. 47, pp. 1535-1543, Aug. 1999.

Andrew V. Grebennikov, "Microwave FET Oscillators: an Analytic Approach to Simplify Computer-Aided Design", Microwave journal, pp. 102-111, Jan. 2000.

B. Van der Pol, "The Nonlinear Theory of Electrical Oscillators,"Proc. IRE, vol. 22 No. 9, pp. 1051-1086, Sep. 1934.

Byeong-Ha Park, "A Low-Voltage, Low Power, CMOS 900 MHz Frequency Synthesizer," Ph.D. Dissertation, Georgia Institute of Technology, Dec. 1997.

C. Arnaud, D. Basataud, J. Nebus, J. Teyssler, J. Villotte, D. Floriot, "An Active Pulsed RF and Pulsed DC Load-Pull System for the Characterization of HBT Power Amplifiers Used in Coherent Radar and Communication Systems," IEEE Transactions on Mfl, vol. 48, No. 12, pp. 2625-2629, Dec. 2000.

D. B. Leeson, A Simple Model of Feedback Oscillator Noise Spectrum, Proc. IEEE, pp. 329-332, 1966.

F. X. Sinnesbichier, B Hauntz and 0. R. Olbrich, "A Si/SiGe HBT Dielectric Resonator Push-Push Oscillators at 58 GHz," IEEE Microwave Guided Wave Lett. vol. 10, pp. 145-147, Apr. 2000.

F. X. Sinnesbichler and 0. R. Olbrich, "SiGe HBT Push-Push Oscillators for V-Band Operation," IEEE MTT-S silicon Monolithic Integrated Circuits in RF Systems Symp., Garmisch, Germany, Apr. 26-28, 2000, pp. 55-59.

F. X. Sinnesbichler, B. Hautz, G. R. Olbrich,"A Low Phase Noise 58 GHz SiGe HBT Push-Push, Oscillator with Simultaneous 29 GHz Output", IEEE, MTT-S Digest, pp. 35-38, 2000.

F. X. Sinnesbichler, H. Geltinger, and G. R. Olbrich, "A 38 0Hz Push-Push Oscillator Based on 25 GHZ-fT BJTs," IEEE Microwave Guided Wave Lett. vol. 9 pp. 151-153, Apr. 1999.

F.M. Ghannouchi, R. Larose, R.G. Bosisio, "A New Multi-harmonic Loading Method for Large-Signal Microwave and Millimeter-Wave Transistor Characterization," IEEE Transactions on MTT, vol. 39, No. 6, pp. 986-992, Jun. 1991.

Franco Ramirez, Jose Lius Garcia H., Tomas Fernandez and Almudena Suarez, "Nonlinear Simulation Techniques for the Optimized Design of Push-Push Oscillators", IEEE, MTT-S Digest, pp. 2157-2160, 2003.

Franz X. Sinnesbichier, "Hybrid Millimeter-Wave Push-Push Oscillators Using Silicon-Germanium HBTs," IEEE MTT-S, vol. 51, Feb. 2003.

H. Abe, Y. Aono, "11 GHz GaAs Power MESFET Load-Pull Measurements Utilizing a New Method of Determining Tuner Y-Parameters, IEEE Transactions on Microwave Theory and Techniques," vol. 27, No. 5, pp. 394-399, May 1979.

H. Stark, and J. W. Woods, Probability, Random Processes, and Estimation Theory for Engineers. New York: Prentice-Hall, 1986.

Hai Xiao, Takayuki Tanka and Masayoshi Aikawa, "A Ka-Band Quadruple-Push Oscillator", IEEE, MTT-S Digest, pp. 889-892, 2003.

Heng-Chia Chang, "Analysis of Coupled Phase-Locked Loops With Independent Oscillators for Beam Control Active Phased," IEEE Trans. MTT, vol. 52, pp. 1059-1065, Mar. 2004.

Heng-Chia Chang, Xudong Cao, Mark J. Vaughan, Umesh K. Mishra, and R. York,"Phase Noise in Externally Injection-Locked Oscillator Arrays," IEEE Trans. MTT, vol. 45, pp. 2035-2042, No. 1997.

Heng-Chia Chang, Xudong Cao, Umesh K. Mishra, and R. York, "Phase Noise in Coupled Oscillators: Theory and experiment," IEEE Trans. MTT, vol. 45, pp. 604-615, May 1997.

J. Everard, Fundamentals of RF Circuit Design with Low Noise Oscillators, John Wiley & Sons. Ltd, 2001.

J. Heinbockel and A. Mortazawi, "A Periodic Spatial Power Combining MESFET Oscillator", IEEE, MTT-S Digest, pp. 545-548, 1992.

J. R. Bender, C. Wong, Push-Push Design Extends Bipolar Frequency Range, Microwave & RF, pp. 91-98, Oct. 1983.

Jeong-Geun Kim, Dong-Hyun Baek, Sang-Hoon Jeon, Jae-Woo Park and Songcheol Hong,"A 60 GHz InGaP/GaAs HBT Push-Push MMIC VCO," IEEE, MTT-S Digest, pp. 885-888, 2003.

Jonathan J. Lynch and Robert A. York, "Synchronization of Oscillators Coupled through Narrow-Band Networks," IEEE Trans. MTT, pp. 238-249, Feb. 2001.

Jonathan J. Lynch and Robert A. York, "An Analysis of Mode-Locked Arrays of Automatic Level Control Oscillators," IEEE Trans. on Circuits and Systems-I, vol. 41, pp. 859-865, Dec. 1994.

Jwo-Shiun Sun, "Design Analysis of Microwave Varactor-Tuned Oscillators", Microwave journal, pp. 302-308, May 1999.

K. Poddar, "A Novel Approach for Designing Integrated Ultra Low Noise Microwave Wideband Voltage-Controlled Oscillators," Dec. 14, 2004.

K. W. Kobayashi et al., "A 108-0Hz InP-based HBT Monolithic Push-Push VCO with Low Phase Noise and Wide Tuning Bandwidth," IEEE J. Solid-State Circuits, vol. 34, pp. 1225-1232, Sep. 1999.

K.O, "Estimation Methods for Quality Factors of Inductors Fabricated in Silicon Integrated Circuit Process Technologies," IEEE, JSSS, pp. 1565-1567, Sep. 1997.

Kaneyuki Kurokawa, "Noise in Synchronized Oscillators," IEEE Trans. MTT, vol. 16, pp. 234-240, Apr. 1968.

Kaneyuki Kurokawa, "The Single Cavity Multiple Device Oscillator," IEEE Trans. MTT, vol. 19, pp. 793-801, Oct. 1971.

Klaus F. Schunemann and Karl Behm, "Nonlinear Noise Theory for Synchronized Oscillators," IEEE Trans. MTT, vol. 27, pp. 452-458, May 1979.

L. Dussopt, D: Guillois, and 0. Rebeiz, "A Low Phase Noise Silicon 9 0Hz VCO and an 18 0Hz Push-Push Oscillator," IEEE MTT-S. Digest, 2002, pp. 695-698.

M. Kuramitsu and F. Takasi, "Analytical method for Multimode Oscillators Using the Averaged Potential," Elec. Communication Japan, vol. 66-A, pp. 10-19, 1983.

M. Odyniec, Editor, RF and Microwave Oscillator Design, Chapter 3: Linearity, Time Variation, and Oscillator Phase Noise, by T. Lee and A. Hajimiri, Artech House, 2002.

M. Regis, 0. Llopis, and J. Graffeuil, "Nonlinear Modeling and Design of Bipolar Transistor Ultra Low Phase-Noise Dielectric-Resonator Oscillators", IEEE transaction on MTT, vol. 46, No. 10, pp. 1589-1593, Oct. 1998.

M. Shott, H. Kuhnert, J. Hifsenbeck, J. Wurtf, and H. Heinrich, "38 GHz Push-Push GaAs-HBT MMIC Oscillator,"IEEE MTT-S, Digest, 2002, pp. 839-842.

M. Ticbout, "Low power, Low Phase Noise, Differentially Tuned Quadrature VCO Design in Standard CMOS," IEEE- JSSS, vol. 36, pp. 10 18-1024, Jul. 2001.

Mortazawi A and B. C. De Loach, Jr., "Multiple Element Oscillators Utilizing a New Power Combining Technique," in IEEE MTT-S Tnt. Microwave Symp. Dig., 1992, pp. 1093-1096.

P. Berini, M. Desgagne, F.M. Ghannouchi, R.G. Bosisio, "An Experimental Study of the Effects of Harmonic Loading on Microwave MESFET Oscillators and Amplifiers," IEEE Transactions on MTT, vol. 42, No. 6, pp. 943-950, Jun. 1994.

Q. Cai, J. Gerber, S. Peng, "A Systematic Scheme for Power Amplifier Design Using a Multi-Harmonic Load-Pull Simulation Technique," 1998 IEEE MTT-S Symposium Digest, vol. 1, pp. 161-165, Jun. 7-12, 1998.

R. A. York and R.C. Compton,"Mode-Locked Oscillator Arrays", IEEE Microwave and Guided Letter, vol. 1, pp. 215-218, Aug. 1991.

R. A. York, "Nonlinear Analysis of Phase Relationship in Quasi-Optical Oscillator Arrays,"IEEE Trans. Microwave Theory Tech., vol. 41, pp. 1799-1809, Oct. 1993.

R. A. York, P. Liao, and J. J. Lynch, "Oscillator Array Dynamics with Broad-Band N-Port Coupling Networks," IEEE Trans. Microwave Theory Tech., vol. 42, pp. 2040-2045, Nov. 1994.

R. Adler, "A Study of Locking Phenomena in Oscillators," Proc. IEEE, vol. 61, pp. 180-1385, Oct. 1973.

R. G. Freitag, S.H. Lee, D.M. Krafcsik, D.E. Dawson and J. E. Degenford, "Stability and Improved Circuit Modeling Considerations for High Power MMIC Amplifiers", IEEE, MM-Wave Monolithic Circuits Symposium, pp. 2169-2172, 2003.

R. J. Hawkins, "Limitations of Nielsen's and Related Noise Equations Applied to Microwave Bipolar Transistors and a New Expression for the Frequency and Current Dependent Noise Figure," Solid-State Electron., vol. 20 pp. 191-196, 1977.

Reidar L. Kuvas, "Noise in Single Frequency Oscillators and Amplifiers," IEEE Trans. Microwave Theory Tech., vol. MTT-21, pp. 127-134, Mar. 1973.

Ronald G. Freitag, "A Unified Analysis of MMIC Power Amplifier Stability," IEEE, MTT-S Digest, pp. 297-300, 1992.

S. Kudszus, W. H. Haydi, A. Tessmann, W. Bronner, and M. Schlechtweg, "PushPush Oscillators for 94 and 140 0Hz Applications Using Standard Pseudomorphic GaAs HEMTs," IEEE MTT-S, Microwave Symp. Digest, 2001, pp. 1571-1574.

Shigeji Nogl, Jenshan Lin and Tatsuo Itoh., Mode Analysis and Stabilization of a Spatial Power Combining Array with Strongly Coupled oscillators, IEEE, MTT, vol. 41, pp. 1827-1837, Oct. 1993.

Shih-Chieh Yen and Tah-Hsiung Chu, "An Nth-Harmonic Oscillator Using an N-Push Coupled Oscillator Array with Voltage-Clamping Circuits", IEEE, MTT-S Digest, pp. 545-548, 1992.

T. H. Hsu and C.P. Snapp, "Low-Noise Microwave Bipolar Transistor with Sub-Half-Micrometer Emitter Width," IEEE Trans. Electron Devices, vol. ED-25, pp. 723-730, Jun. 1978.

U. L. Rohde, "A New and Efficient Method of Designing Low Noise Oscillators," Ph.D. Dissertation, Technical University of Berlin, Feb. 12, 2004.

U. L. Rohde, A. K. Poddar, Juergen Schoepf, Reimund Rebel, and Parimal Patel, "Low Noise Low Cost Wideband N-Push VCO," IEEE, IMS Symposium, MTT2005, USA.

U. L. Rohde, K. Juergen Schoepf, A.K. Poddar, "Low Noise VCOs Conquer Wideband," Microwaves & RF, pp. 98-106, Jun. 2004.

U.L. Rohde, "Improved Noise Modeling of GaAs FETS: Using an Enhanced Equivalent Circuit Technique." Microwave Journal, pp. 87-101—Nov. 1991.

U.L. Rohde, "Parameter Extraction for Large Signal Noise Models and Simulation of Noise in Large Signal Circuits Like Mixers and Oscillators," 23rd European Microwave Conference, Madrid, Spain, Sep. 6-9, 1993.

W. 0. Schlosser, "Noise in Mutually Synchronized Oscillators," IEEE Trans. Microwave Theory Tech., vol. MTT-16, pp. 732-737, Sep. 1968.

WA. Pucel, W. Struble, R. Hallgren, U.L. Rohde, "A General Noise Dc-embedding Procedure for packaged Two-Port Linear Active Devices," IEEE Transactions on MTT, vol. 40, No. 11, pp. 2013-2024, Nov. 1992.

Wing Shing Chan et al: "The design of oscillators using the cascode circuit" Circuits and Systems, 1994, vol. 5, pp. 689-692, May 30, 1994.

Y. Baeyens et al., "Compact InP-based HBT VCOs with a Wide Tuning Range at W-Band," IEEE Trans. MTT, vol. 48, pp. 2403-2408, Dec. 2001.

Y. Sun, T. Tieman, H. Pflung, and W. Velthius, "A Fully Integrated Dual-Frequency Push-Push VCO for 5.2 and 5.8GHz Wireless Applications," Microwave Journal., pp. 64-74, Apr. 2001.

Yu-Lung Tang and Huei Wang, "Triple-Push Oscillator Approach: Theory and Experiments," IEEE- JSS, vol. 36, pp. 1472-1479, Oct. 2001.

* cited by examiner

LOW NOISE, HYBRID TUNED WIDEBAND VOLTAGE CONTROLLED OSCILLATOR

CROSS-REFERENCE TO RELATED APPLICATIONS

This application claims the benefit of the filing date of U.S. Provisional Patent Application No. 60/601,823 filed Aug. 16, 2004, the disclosure of which is hereby incorporated herein by reference.

BACKGROUND OF THE INVENTION

A voltage controlled oscillator (VCO) or oscillator is a component that can be used to translate DC voltage into a radio frequency (RF) voltage or signal. The magnitude of the output signal is dependent on the design of the VCO circuit and the frequency of operation is determined, in part, by a resonator that provides an input signal. In general, VCOs are designed to produce an oscillating signal at a particular frequency 'f' that corresponds to a given tuning voltage. In particular, the frequency of the oscillating signal is dependent upon the magnitude of a tuning voltage $V_{tune}$ applied to a tuning diode network across a resonator circuit. The frequency 'f' may be varied from $f_{min}$ to $f_{max}$ and these limits are referred as the tuning range or bandwidth of the VCO. The tuning sensitivity of the VCO is defined as the change in frequency over the tuning voltage and it is desirable to tune the VCO over a wide frequency range within a small tuning voltage range.

Clock generation and clock recovery circuits typically use VCOs within a phase locked loop (PLL) to either generate a clock from an external reference or from an incoming data stream. VCOs affect the performance of PLLs. In addition, PLLs are typically considered essential components in communication networking as the generated clock signal is typically used to either transmit or recover the underlying service information so that the information can be used for its intended purpose. PLLs are also important in wireless networks as they enable the communications equipment to quickly lock onto the carrier frequency on which communications are transmitted.

The popularity of mobile telephones has renewed interest in and generated more attention in wireless architectures. This popularity has further spawned renewed interest in the design of low noise wideband oscillators. In that regard, most mobile communication systems include a tunable VCO as a component in a frequency synthesizer, which selectively provides a choice of the desired channel. The recent explosive growth in the new families of cellular telephones and base stations using universal mobile telephone systems (UMTS) has stirred a need for developing an ultra-low noise oscillator with a fairly wide tuning range. The demands of wideband sources have generally increased telescopically because of the explosive growth of wireless communications. In particular, modern communication systems are typically multi-band and multi-mode, therefore requiring a wideband low noise source that preferably allows simultaneous access to DCS 1800, PCS 1900 and WCDMA (wideband code division multiple access) networks. The commercial handsets employed by these and other next generation networks are typically required to be capable of handling not only voice data; but also image and video data. Therefore, the radio link typically has to deal with signals that are more digitally complex.

Despite the continuous improvement in VCO technology, low phase noise typically remains a bottleneck and poses a challenge to RF transceiver (transmitter-receivers) design. Furthermore, oscillator/VCO design typically poses a challenge to the RF trans-receiver system. This is typically considered due to the more demanding parameters of the VCO design: low phase noise, low power consumption and wide frequency tuning range. For example, in a receiver, the phase noise of the local oscillator limits the ability to detect a weak signal in the presence of a strong signal in an adjacent channel. In a transmitter, phase noise results in energy being transmitted outside the desired channel or band.

A resonator is an important module in an oscillator circuit. MEMS (micro-electromechanical systems), SAW (surface acoustic wave) and ceramic-based resonators offer high Q factors but are relatively expensive and not easily amenable to the integrated circuit form. The Q factor of a resonator is typically considered a key factor for low phase noise performance, but the overall oscillator performance is generally controlled by the time average loaded Q of the oscillator circuit. Ceramic resonator-based oscillators are used in wireless applications, and typically provide low phase noise at fixed frequencies. Unfortunately, ceramic oscillators have disadvantages including a relatively limited operating temperature range, tuning range (which limits the amount of correction that can be made to compensate for the tolerance of other components in the oscillator circuitry) and an increased sensitivity to phase hits in the PLL.

In addition, oscillator circuitry becomes susceptible to phase-jitter and phase-hits due to noise-interference that is typically present on the tuning control voltage and resonator network. A VCO that outputs a frequency that is less sensitive to tuning control voltage fluctuations imparts less phase jitter to the system, but suffers from a narrower tuning range, which limits its tuning band. In applications where coarse-tuning and fine-tuning is required, phase noise performance typically suffers in the presence of a fine-tuning network that is incorporated with a coarse tuning network. Further, the fine-tuning network typically adds extra noise and loading to the resonator circuit. Thus, the performance of the tuning circuit network is becoming even more important.

FIG. 1A, for example, depicts a typical prior art oscillator 100. The oscillator includes an active device 103 or Q1 having a collector terminal $103_1$, a base terminal $103_2$ and an emitter terminal $103_3$. A frequency selective network is provided via a micro-stripline resonator 107 that is capacitively coupled via capacitor Cc1 to the base terminal $103_2$. The micro-stripline resonator 107 is also capacitively coupled to a tuning network 110 via capacitor $C_{c2}$. A voltage source $V_t$ is coupled to the tuning network 110 via a resistor 114. A biasing network 120 is coupled to the collector terminal $103_1$. A first feedback capacitor C1 is connected between the base and emitter terminals, $103_2$ and $103_3$ respectively. The capacitor C1 is also coupled to capacitor C2, which is grounded. The frequency of the resonator 107 is tunable over a frequency band by adjusting the voltage output of the source $V_t$. This results in the operating or oscillation frequency of the oscillator 100 to be tuned over an output frequency band, which is detectable at the terminal labeled $P_{out}$.

In the oscillator of FIG. 1A, the micro-stripline resonator generally needs to have a relatively low impedance for a high Q factor over the desired tuning range. The resonator may be produced by an etching in a micro-stripline. Therefore, the oscillator frequency is affected by the tolerance values of the components used without generally having an effect on the resonator frequency. However, micro-stripline resonator-based oscillator circuitry typically exhibits a high degree of sensitivity to changes in the surrounding environment causing them to become microphonic and sensitive to noise interference. Stripline resonators are less sensitive to microphonic and other types of interference, since they are self-shielding due to their dual ground plane structure. However, choosing a stripline based resonator generally results in a lower Q (for same physical dimension as compared to a micro-stripline) and higher capacitance at given frequency range. In addition, micro-stripline or stripline resonators typically take up valuable space on the oscillator's circuit board. Therefore, there is a need to retain the higher Q's associated with the micro-stripline, while providing the additional shielding against interference, in particular microphonic interference, available in a stripline, as well as minimizing the amount of board area required to implement the micro-stripline resonator.

FIG. 1B shows a schematic of a prior art oscillator that operates as a hybrid-tuned (coarse/fine) ultra low noise wideband voltage controlled oscillator. Normally, a fine-tuning network 150, as shown in the FIG. 1B, adds extra noise and loading to the resonator circuit 107, which in turn makes the tuning networks 110, 150 more critical. Circuits of the type shown in FIG. 1B normally exhibit poor phase noise performance over the desired tuning range (e.g., 1200-3600 MHz). In addition, the tuning range is limited because of the stability factor of the negative resistance-generating device, i.e., the transistor Q1, over the frequency band.

Of utility then are methods, apparatus and systems that provide a low noise wideband VCO using stripline or micro-stripline technology. Of additional utility are methods, apparatus and systems that provide an ultra-low noise, hybrid tuned and power-efficient wideband VCO.

SUMMARY OF THE INVENTION

An aspect of the present invention is an oscillator. The oscillator preferably comprises an active device having first, second and third terminals and a plurality of micro-stripline resonators coupled together to form a coupled-resonator network, the coupled-resonator network being coupled to the second terminal of the active device. Most preferably, the oscillator further includes a tuning network coupled to the coupled-resonator network, the tuning network being operable to adjust the coupling between at least two of the resonators that form the coupled resonator network.

In accordance with this aspect of the present invention, the oscillator further preferably includes circuitry connected across the tuning network and the coupled-resonator network, the circuitry being operable to adjust the conduction angle of the active device as a tuning voltage associated with the tuning network is adjusted.

Further in accordance with this aspect of the present invention, the tuning network is further operable to adjust a resonant frequency associated with the coupled-resonator network. It also desirable that at least two of the plurality of micro-stripline resonators are inductively coupled together to form the coupled resonator network.

Further in accordance with this aspect of the present invention, the oscillator may be fabricated on a stripline board such that the micro-stripline resonators are disposed in a layer of the board. Further still, the oscillator may be fabricated in FR4 or Roger material.

Further in accordance with this aspect of the present invention, the coupled-resonator network includes a center strip as an open transmission line in the form of an etched structure having a wavelength that is shorter than the quarter-wavelength of the oscillator's operating frequency. The coupled-resonator network may further desirably include a voltage-controlled variable-capacitance diode coupled to the second terminal of the active device.

Further still in accordance with this aspect of the present invention, the coupled-resonator network may comprise an asymmetric coupled micro-stripline having stages that are disposed in a housing in a surface mounted device.

This aspect of the present invention may further desirably comprise a pair of transistors in a cascode configuration such that the coupled-resonator network is coupled to the base of each transistor.

In another aspect, the present invention comprises an oscillator. The oscillator preferably comprises a transistor having base, emitter and collector terminals; a tuning network coupled to the base of the transistor, the tuning network being operable to tune the operating frequency of the oscillator over a frequency band; and a noise filter coupled to the emitter of the transistor and the tuning network. The oscillator may further desirably comprise circuitry coupled to the base of the transistor and the tuning network for electronically tuning the conduction angle of the transistor as the operating frequency of the oscillator is tuned over the frequency band.

Further in accordance with this aspect of the present invention, the conduction angle is adjusted by tuning the drive level of the transistor.

Further in accordance with this aspect of the present invention, the transistor is selected from the group consisting of a bipolar transistor and a field effect transistor.

Further still in accordance with this aspect of the present invention, the oscillator further preferably comprises a noise feedback and bias circuit coupled between the collector and base of the transistor for maintaining a voltage level appearing at the collector over the operating temperature range of the oscillator.

In addition, the tuning network desirably comprises a first network for tuning the operating frequency over a first range and a second network for tuning the operating frequency within the first range.

In an additional aspect, the present invention includes a voltage controlled oscillator comprising a housing enclosing an oscillator stage having a coupled micro-stripline resonator and associated passive components mounted using a surface mount design technology. In accordance with this aspect of the present invention, the resonator comprises a surface mounted discrete planar resonator. The resonator may also desirably a multi-layer surface mounted in ceramic, FR4 or Roger media. Further still in accordance with this aspect of the present invention, the micro-stripline resonator is preferably formed by a stripline resonator that includes an air-cavity in a multiplayer board. In addition, the micro-stripline resonator may comprise an asymmetric micro-stripline resonator.

In another aspect, the present invention comprises a hybrid tuning (coarse/fine) network for coarse-tuning and fine-tuning oscillator circuitry to avoid loading and degradation of the Q factor over the tuning range.

In another aspect, the present invention comprises a high Q resonator in either a micro-stripline or stripline configuration. The Q factor of the coupled line is improved by making an air-cavity in the multiplayer board so that the stripline-coupled resonator behaves like a micro-stripline resonator, thereby providing the advantage of a higher Q factor (as in a micro-stripline) and shielding effect (as in a stripline) that reduces the phase hit and phase jitter over the tuning range.

In another aspect, the present invention comprises a plurality of resonators coupled in a middle layer of a circuit board thereby improving the noise interference and reducing the phase-hit and phase-jitter performance.

In another aspect, the present invention is a method for manufacturing a discrete surface mountable resonator in which uniform capacitance is obtained from the central strip of the coupled line, and the edge-coupled line improves the mode convergence thereby improving the Q factor of the resonator.

In another aspect, the present invention provides a current efficient ultra low noise VCO by incorporating a planar resonator that may be implemented in a discrete embodiment of a planar surface mounted resonator in ceramic or other media.

In accordance with a further aspect of the present invention, a voltage controlled oscillator circuit is provided. The circuit preferably comprises an active feedback element (e.g., a 3-terminal device such as a bipolar/FET), a frequency-determining element (resonator), and a tuning network. In addition, the oscillator preferably includes a negative resistance generator. Most preferably, the resonator comprises a coupled resonator and a plurality of varactors. The negative resistance generator is desirably dynamically coupled to the resonator and is configured to maintain a stability factor for guaranteed and sustained oscillation (loop gain should be greater than one) over the tuning range.

As integrated circuits are generally of planar type, only those resonators having a planar structure, such as microstrip resonators, are suitable for the integrated chip form. A conventional micro-strip resonator is a planar structure, having a low Q factor, but provides poor phase noise performance in comparison to ceramic and SAW resonator-based oscillators. In accordance with an aspect of the present invention the Q-factor of the planar resonator is improved so as to allow for relatively easy replacement of the ceramic and SAW resonator-based oscillators and provide oscillators that are amenable for an integrated circuit form.

In accordance with another aspect of the present invention, a compact, hybrid tuned, ultra low noise oscillator that is less prone to phase jitter and phase hits that may occur in a PLL or other applications is provided. The oscillator preferably incorporates a circuit topology that employs a shielded coupled micro-stripline as a resonator network. The oscillator topology improves the phase noise and phase hit performance, and also improves thermal stability over the tuning range. The freedom of selection of the frequency, low phase noise, compact size, reduction in phase hit sensitivity and stability over the operating temperature range makes this technology promising and attractive for next generation high frequency mobile communication systems.

Furthermore, in another aspect of the present invention, a planar resonator may be manufactured or provided as a discrete version of a surface mounted resonator in ceramic or other media.

In another aspect, the present invention provides a voltage-controlled oscillator that comprises a tunable coupled-line resonator to provide better phase noise performance and improve the linear voltage/capacitance transfer function. Accordingly, in accordance with this aspect of the present invention, a voltage-controlled oscillator is provided that has a resonant circuit for generating a tuning frequency. The resonant circuit comprises a coupled-line resonator. In addition, a control line is coupled to the integrated resonating network for varying the tuning frequency of the resonant circuit. A feedback loop is coupled between the active device and the resonator network. The resonator network preferably incorporates a dynamic controlled tuning network to control the drive level and conduction angle of the oscillator circuit as is shown, for example, in FIG. 9.

In a further aspect, the present invention provides a dynamically tuned coupled-micro-stripline resonator, which allows the oscillator to be dynamically tuned over the frequency tuning band for the best phase noise performance. The average noise factor of the circuit is minimized by a noise feedback circuit and the conduction angle of the active device is dynamically controlled by adjusting the optimum drive level corresponding to the desires oscillation frequency as is shown, for example, in FIG. 9.

For those applications where a phase-hit is of more concern, an aspect of the present inventions supports ultra low phase noise performance with a reduction in the effect of phase hits as compared to the ceramic resonator based oscillator. In accordance with an aspect of the present invention, a coupled micro-stripline is employed that effectively increases the Q factor of the resonator as is shown, for example, in FIG. 2. Furthermore, the oscillator circuit shown in FIG. 2 may be advantageously fabricated on a stripline board wherein the coupled lines are disposed on middle layer of the board.

Further in accordance with these aspects of the present invention, topologies that reduce phase hits without degrading the overall performance of the oscillator/VCO's circuit are provided.

In accordance with a further aspect of the present invention, a circuit topology and method is provided that improves the performance of oscillator circuitry or other devices such as a PLL in the presence of a phase-hit. Further still, an aspect of the present invention is the provision of an integrated coupled resonator embedded in a middle layer of a circuit board, thereby improving the overall characteristics of the resonator. The circuit is preferably fabricated on FR4/Roger material; however, the basic structure can be extended to other media, such as ceramic, for other applications that have similar requirements.

In yet another aspect of the present invention, a method is provided for manufacturing a discrete surface mountable resonator in which uniform capacitance is obtained from the central strip of the coupled line, thereby improving the reliability of the resonator. More specifically, in this aspect of the present invention, a surface mountable resonator structure with user defined band/tuning range is provided. An oscillator of this kind provides ultra low noise performance and may replace the ceramic and SAW resonator-based oscillator, which are not only relatively expensive but band limited and sensitive to noise-interference. In accordance with this aspect of the present invention, an oscillator with a coupled-micro-stripline resonator provides a high dynamic loaded Q and, therefore, ultra low phase noise performance with the added advantage of being tolerant of phase-hits.

An advantage of one embodiment of a VCO made in accordance with the various aspects of the present invention is its lower phase noise as compared to a conventional micro-strip resonator, desirable physical dimensions and the shielding of the planar coupled-resonator.

In accordance with yet another aspect of the present invention a hybrid tuned tunable ultra low phase noise oscillator is provided as is shown, for example, in FIG. 7. In accordance with this aspect of the present invention, the oscillator advantageously overcomes the aforementioned disadvantages of phase jitter and phase hits for applications where these parameters are important and is particularly usable at a frequency of 1200-3600 MHz. In addition, as the oscillator may be desirably configured in a standard housing, economies of scale may be achieved via the manufacturing process. As such, these oscillators may be desirably employed in mobile telephones, personal digital assistants, laptops or any other wireless device.

From the foregoing, it may be recognized that the present invention provides a simple, yet effective solution to a class of problems (i.e., those associated with a fixed coupling factor and conduction angle) and overcomes limitations of the prior art that have been accepted as an inherent barriers to the improvement of phase noise performance over an oscillator's tuning range. Dynamically tuning the conduction angle and synchronizing such tuning with noise filtering at the emitter of a bipolar transistor and a tracking filter at the output of the oscillator circuitry desirably improves phase noise performance over the tuning range. In addition, prior art problems associated with a fixed conduction angle in negative resistance oscillators are overcome by use of an electronically tunable conduction angle with respect to the optimum drive level for an improvement in noise performance over the tuning range. Parameters such as phase noise, frequency, output power and harmonic contents are thereby advantageously improved over the tuning range as shown, for example, in FIG. 8. Additional advantages may be attained by circuit-specific selection of the active components, in particular, by making use of the non-overdriven operating mode of the oscillator circuit by incorporating noise feedback DC bias circuit as is described below

DETAILED DESCRIPTION

Figure 1A:
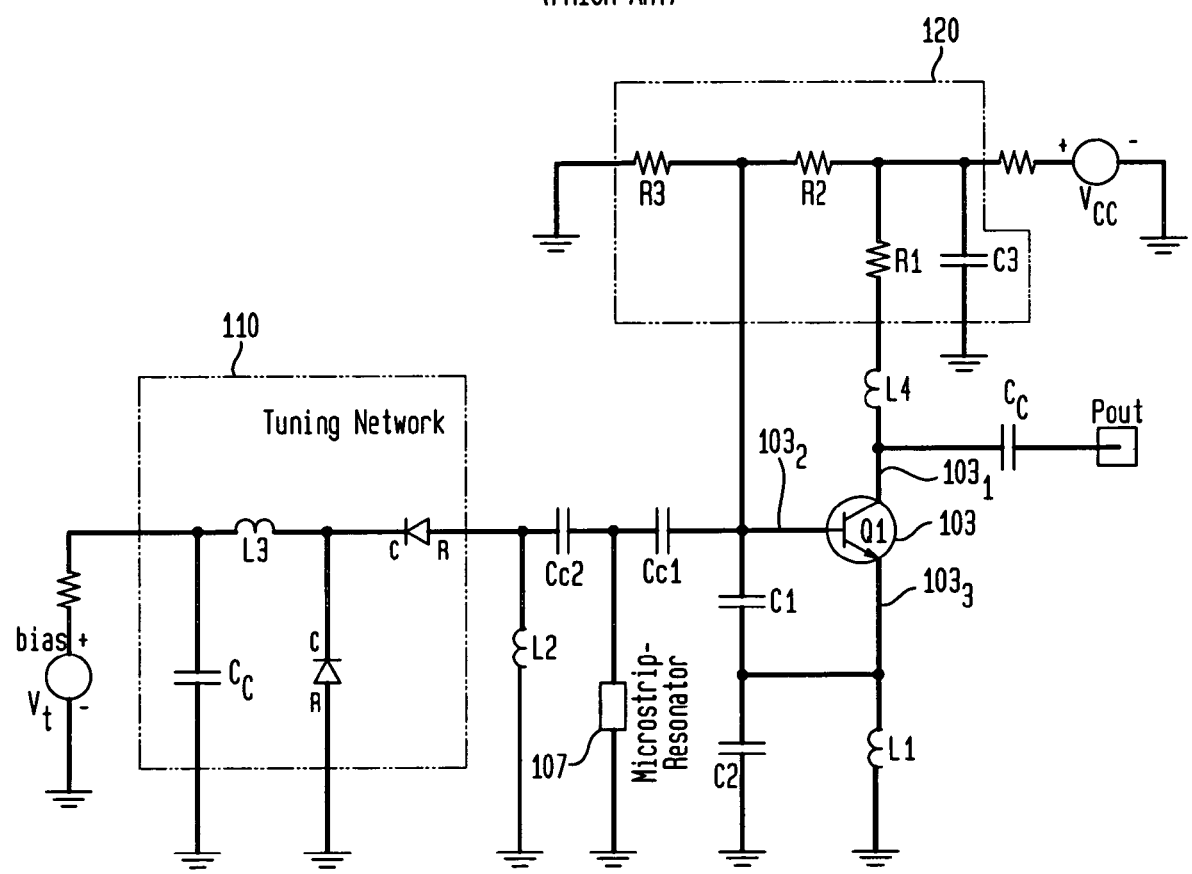
FIG. 1A is a schematic circuit diagram of prior art voltage controlled oscillator.
Figure 1B:
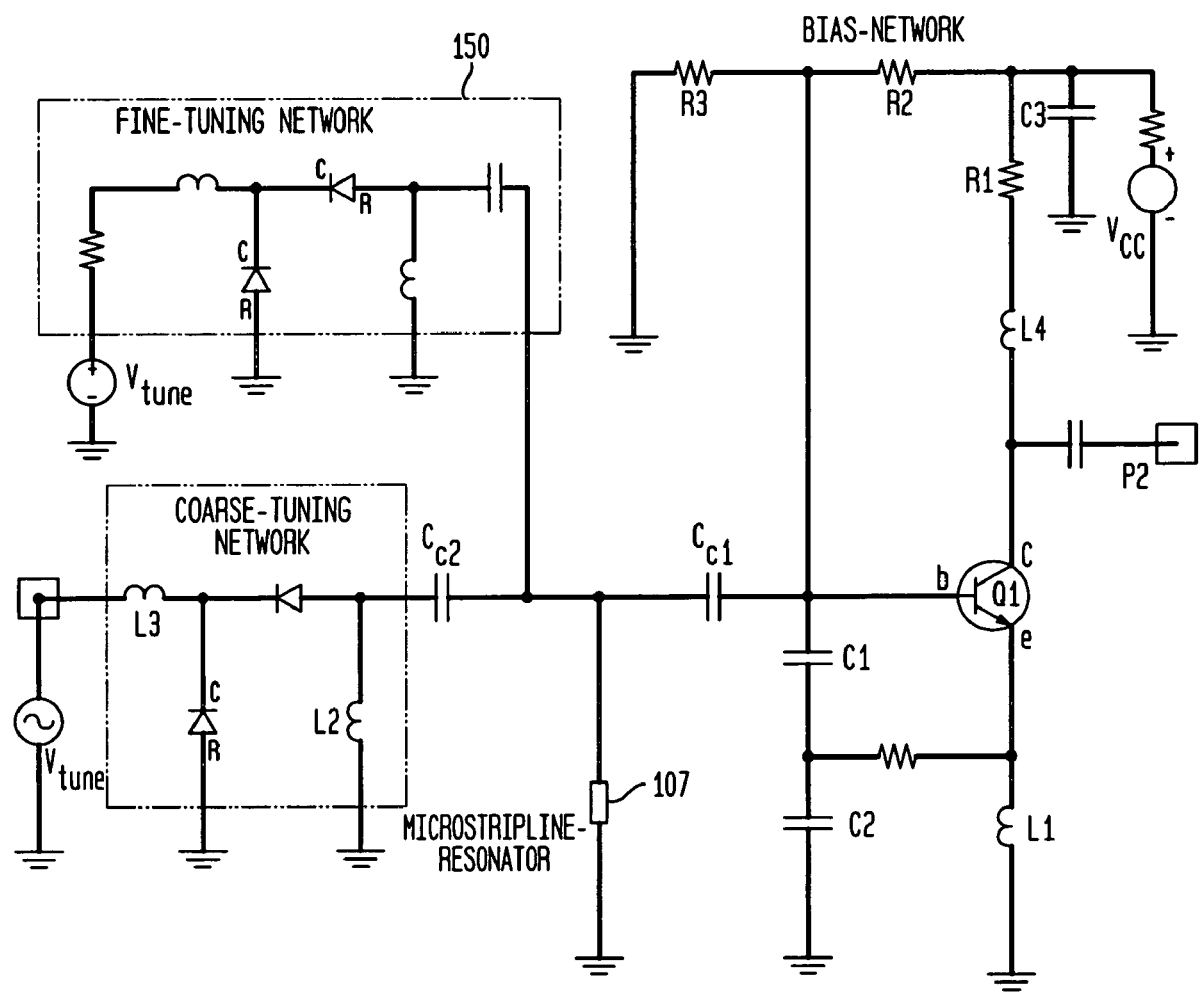
FIG. 1B is a schematic circuit diagram of prior art voltage controlled oscillator.
Figure 2:
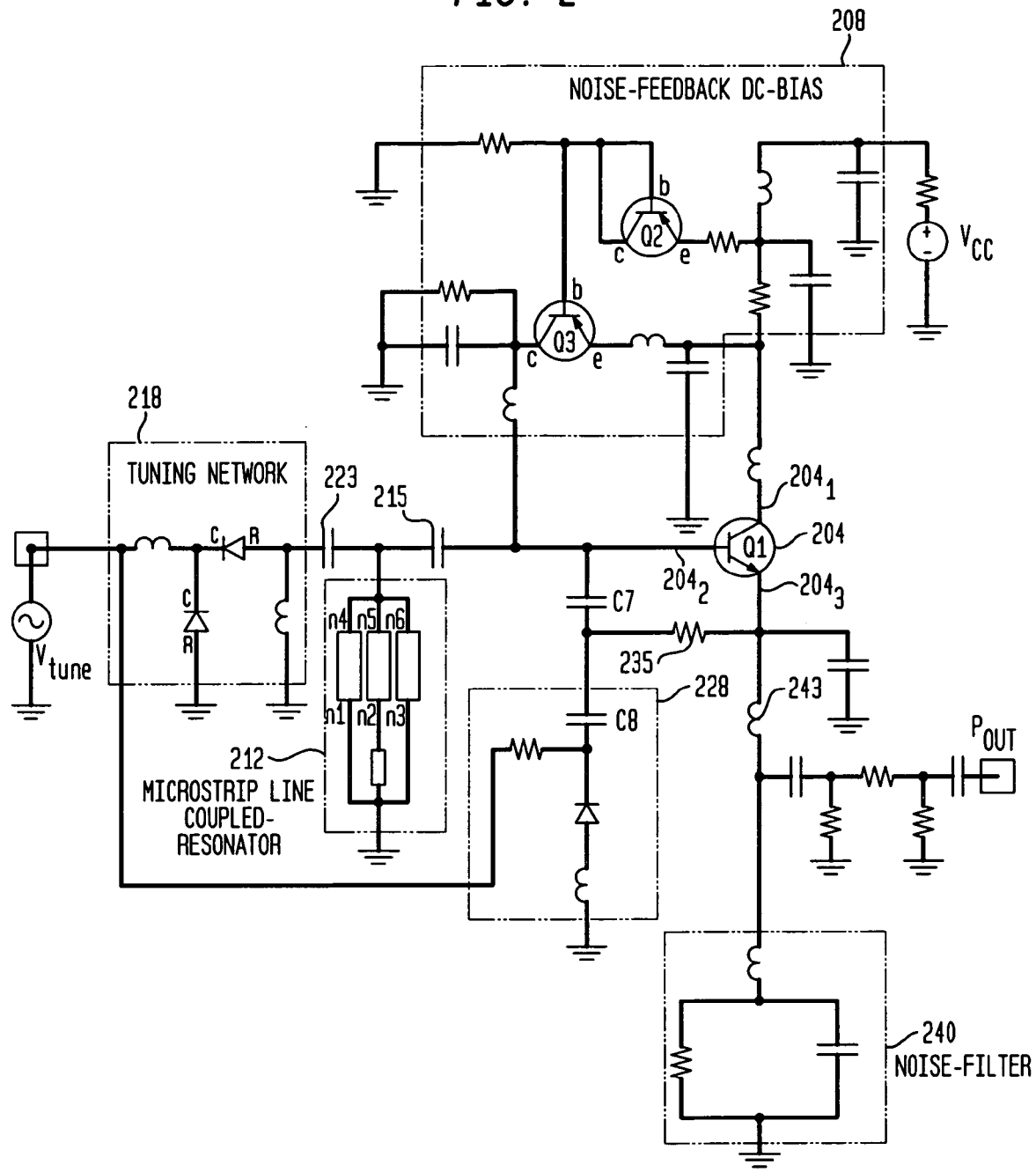
FIG. 2 is a schematic circuit diagram of a voltage controlled oscillator in accordance with an aspect of the present invention.

FIG. 2 is a schematic circuit diagram of voltage controlled oscillator 200 in accordance with an aspect of the present invention. The oscillator 200 includes an active device 204, which in the embodiment shown comprises a bipolar transistor Q1. In general, the active device 204 may comprise any three terminal device that can provide a 180 degree phase shift between the first terminal $204_1$ and second terminal $204_2$. The active device 204 may therefore also comprise a field effect transistor (FET). In the embodiment shown in FIG. 2, the first, second and third terminals $204_1$, $204_2$, $204_3$ of the active device 204 respectively comprise the collector, base and emitter of the transistor Q1.

The oscillator 200 also includes a noise feedback and DC bias network 208 coupled across the first and second terminals $204_1$, $204_2$. The network 208 includes a pair of transistors Q2 and Q3 that, in the arrangement shown, compensate for temperature fluctuations or fluctuations in the supply voltage, $V_{cc}$. The network 208, therefore, allows for frequency stability, at a relatively reduced effort and expense, in the presence of temperature or supply voltage fluctuations. Other advantages result from the fact that it is not necessary to provide an active current source for the supply voltage. In addition, a low supply voltage is possible, which provides an advantage in mobile communication systems for example. In particular, the operating point of the oscillator transistor may be adjusted for a non-overdriven operating mode of the oscillator transistor. In addition to compensating for supply voltage fluctuations, the network 208 feedbacks a select amount of noise to the active device at second terminal $204_2$.

A coupled resonator network 212 is coupled to the second terminal $204_2$ through a coupling capacitor 215. The coupled resonator network 212 preferably comprises a plurality of micro-stripline resonators that are coupled together. For example, the three strips are shown in FIG. 2, between the reference numerals n1 and n4, n2 and n5, n3 and n6, respectively. They are inductively coupled together by the proximity of the center strip located between reference numerals n2 and n5 relatively to the outer strips located between the reference numerals n1 and n4, n3 and n6, respectively. The resonator network 212 is also coupled to a tuning network 218 through coupling capacitor 223.

The oscillator also includes circuitry 228 coupled across the tuning network 218 and the second terminal $204_2$ of the active device 204. In the embodiment shown in FIG. 2, the circuitry 228 is capacitively coupled to the second terminal $204_2$ through coupling capacitors C7 and C8. As is described in further detail below, the circuitry 228 operates to dynamically tune the conduction angle of the active device 204 as the oscillator is tuned over a frequency band via adjustments of voltage supply $V_{tune}$.

A resistor 235 is coupled between the coupling capacitors C7, C8 and to the third terminal $204_3$ of the active device 204. A noise filter 240 is also coupled to the third terminal $204_3$ through inductor 243. An output signal Pout may be capacitively coupled from the third terminal 2043 as is shown in FIG. 2.

In operation, the oscillator of FIG. 2 preferably operates as follows. A voltage is supplied from source $V_{cc}$ through the noise-feedback DC bias network 208 to properly bias the three terminal device 204. As previously discussed, the circuit elements of the network 208 are selected so as to provide a constant bias voltage to the three terminal device 204 over, preferably, the operating temperature range of the device. Once the device 204 is properly biased it outputs a signal onto the terminal $204_3$. A portion of that signal is fed back to the second terminal $204_2$. This causes the device 204 to oscillate at a frequency that is determined by the frequency of the resonator network 212 as well as the values of the capacitors, resistors, and other circuit elements that comprise the oscillator 200. As the tuning voltage $V_{tune}$ is adjusted it causes the frequency output of the resonator network 208 to adjust in frequency while dynamically optimizing the coupling or a coupling factor between the coupled micro-stripline that comprise the resonator network 208. This produces a change in the oscillation frequency of the oscillator 200 at output Pout.

In accordance with an aspect of the present invention, as the tuning voltage $V_{tune}$ is adjusted, the circuitry 228 adjusts the drive levels and conduction angle of the device 204 so as to improve the phase noise performance over the tuning band. As shown in FIG. 2, the circuitry 228 includes a tuning diode $228_1$ coupled to feedback capacitors C7 and C8. The tuning diode $228_1$ adaptively or dynamically optimizes the drive levels and conduction angle associated with the oscillator. In accordance with an additional aspect of the present invention, as the tuning voltage is adjusted, the rejection band associated with the noise filter 240 is also adjusted to filter the harmonic contents of the phase noise over the tuning band. In this way, the tuning of the conduction angle and noise filtering is synchronized. The foregoing results both in improvement in the phase noise performance and extension of the tuning range of the oscillator while simultaneously reducing harmonic content over the tuning band.

Figure 3:
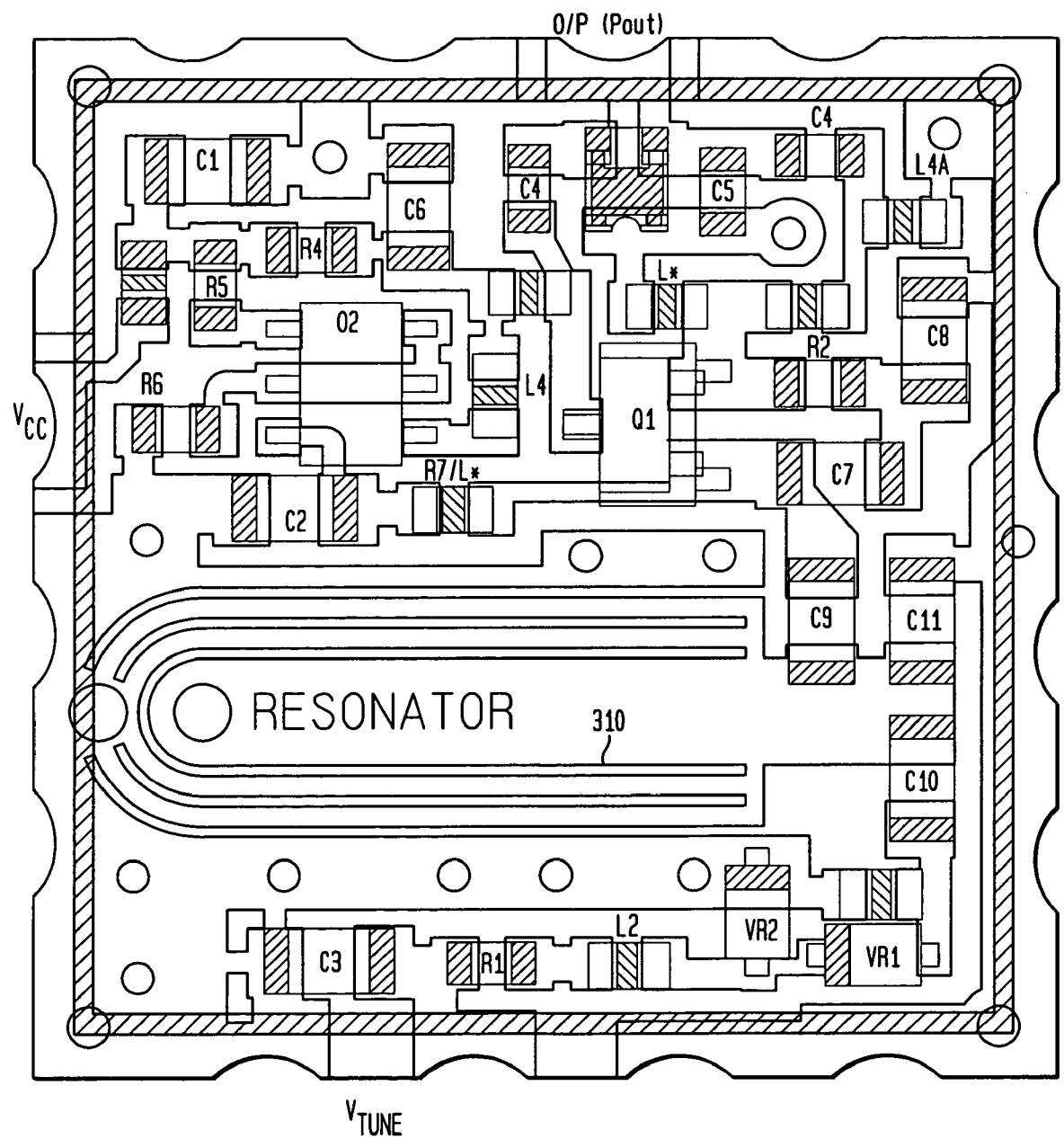
FIG. 3 illustrates the layout of a voltage controlled oscillator in accordance with an aspect of the present invention.

Turning now to FIG. 3, there is shown a schematic of a possible layout of an ultra low noise wideband oscillator 300 of the type shown in the FIG. 2 in accordance with a further aspect of the present invention. The values of the components were selected so that the output frequency at port O/P was wideband selectable over the frequency range of 2000 MHz to 3200 MHz (2 GHz-3.2 GHz). As shown in FIG. 3, in accordance with this aspect of the present invention a voltage controlled oscillator may be implemented in a compact housing. As shown, the oscillator stage includes a distributed resonator along with passive components, e.g., C1, R1, L2, etc., that are mounted using a surface mounting technology. The resonator network may comprise a symmetric or an asymmetric micro-stripline resonator that may be implemented in FR4, Roger, ceramic or any other media. In another aspect of the present invention, the resonator network may be implemented using stripline technology. In that regard, the Q factor of the coupled line is improved by making an air-cavity in the multiplayer board so that the stripline-coupled resonator behaves like a micro-stripline resonator, thereby providing the advantage of a higher Q factor (as in a micro-stripline) and shielding effect (as in a stripline) that reduces the phase hit and phase jitter over the tuning range.

In an additional aspect of the present invention, uniform capacitance may be obtained in a distributed domain by incorporating a surface mountable resonator of the type shown FIG. 3 from the center strip 310 of the coupled lines. This results in improvement in the reliability of the resonator.

Figure 4:
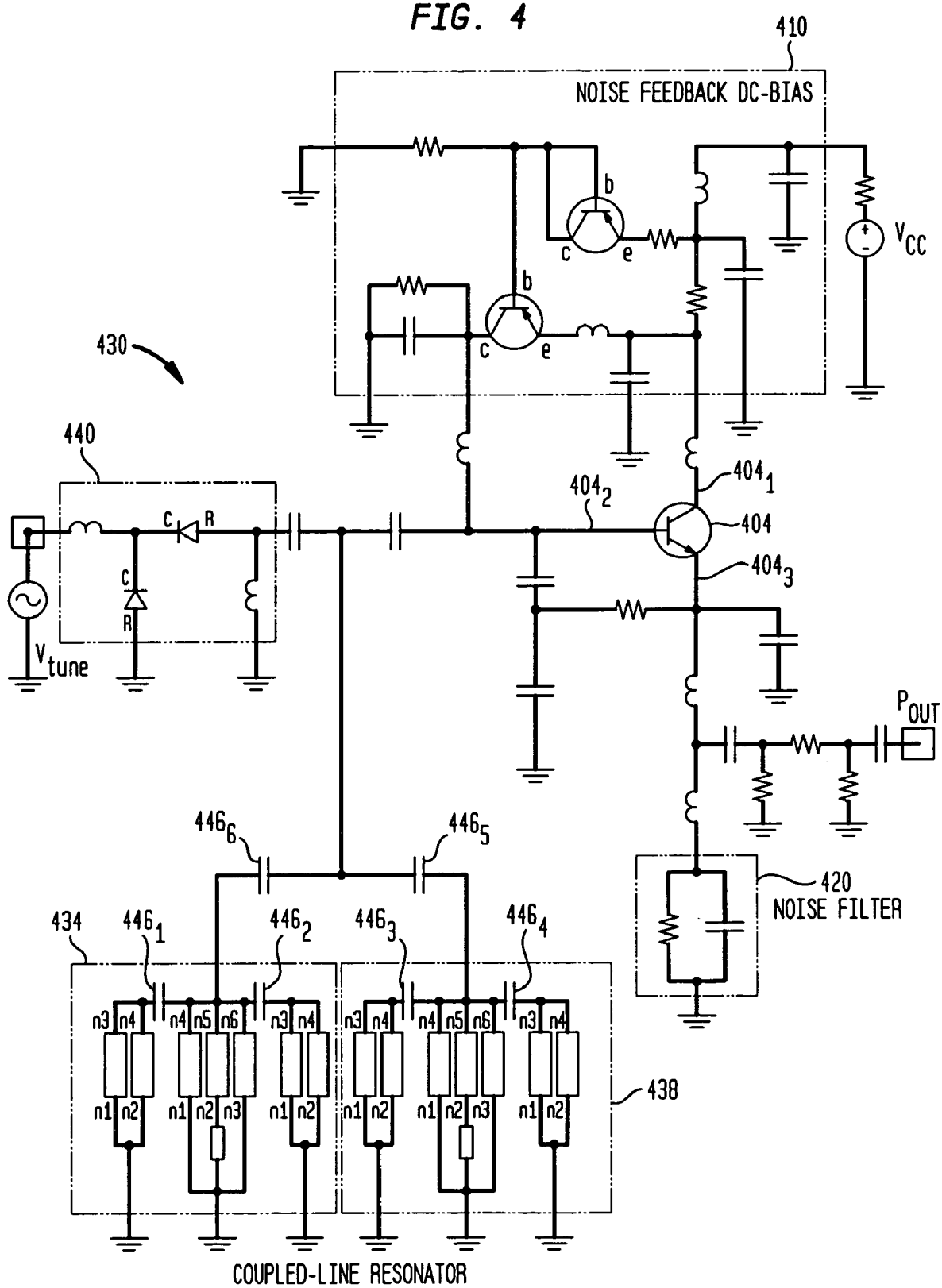
FIG. 4 is a schematic circuit diagram of a voltage controlled oscillator in accordance with an aspect of the present invention.

FIG. 4 illustrates an oscillator 400 in accordance with a further aspect of the present invention. As shown, the oscillator comprises an active three terminal device 404. In the preferred embodiment, the active device 404 comprises a bipolar transistor Q1. In the preferred embodiment, the oscillator 400 includes a noise-feedback DC-bias circuit 410 coupled between the collector terminal $404_1$ and base terminal $404_2$ of Q1. A noise filter 420 is coupled to the emitter terminal $404_3$ as shown. The oscillator further includes a dual coupled line resonator network 430, which is capacitively coupled to the base terminal $404_2$. The dual resonator network 430 comprises two separate resonator networks 434, 438. A tuning network 440 is also capacitively coupled to the resonator network 430. Although FIG. 4 does not include circuitry for dynamically tuning the conduction angle, it should be understood that such circuitry may connected between the tuning network 440 and active 404 as shown in FIG. 2. Furthermore, in principle the oscillator 404 operates as discussed above for FIG. 2.

The resonator 430 uses an inductively and capacitively coupled micro-stripline resonator that improves phase noise performance and associated phase jitter over the tuning range. Inductive coupling occurs between each resonator strip as discussed in above in relation to FIG. 2. As shown, the resonator networks 434, 438, as well the strips that make up these networks are capacitively coupled together via coupling capacitors 446. The resonator structure also preferably includes a center strip as an open transmission line in the form of an etched structure with a wavelength that is shorter than a quarter-wavelength of the desired frequency.

The resonator is preferably an asymmetric coupled micro-stripline and the stages are disposed in a standardized housing as in a SMD (surface mounted device) technology. By way of example, the etched structure of the resonator may be provided as a micro-stripline, as a coplanar structure, or as a slot structure or embedded in a multiplayer board. In other words, the resonator may be made by either the monolithic technique or a hybrid technique.

Figure 5:
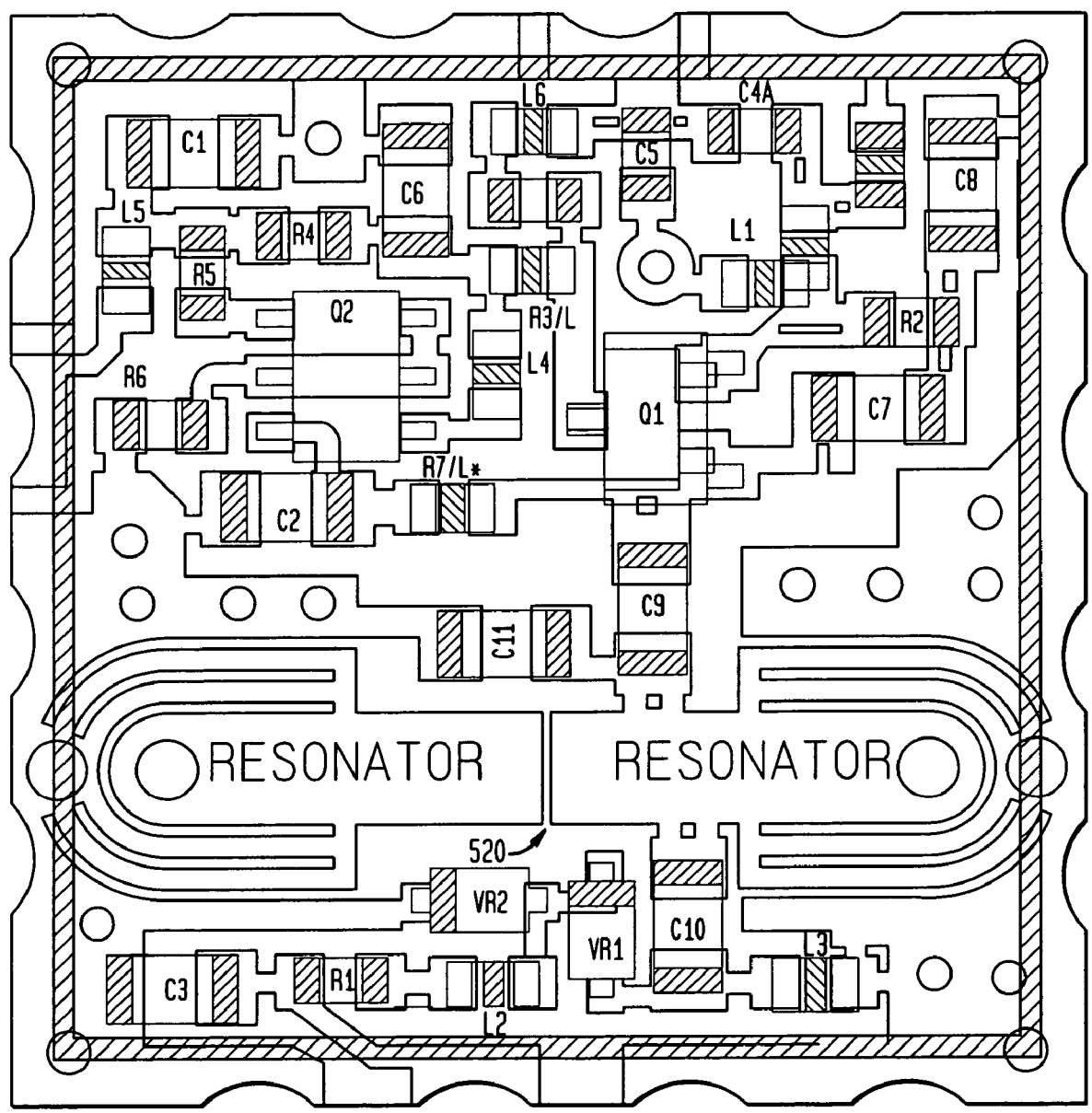
FIG. 5 illustrates the layout of a voltage controlled oscillator in accordance with an aspect of the present invention.

Turning now to FIG. 5, there is shown a schematic of a possible layout of an oscillator 500 designed in accordance with FIG. 4. In FIG. 5, the value of the elements were chosen so that the oscillator operated over a tuning range of 2.0-3.2 GHz. As shown, the oscillator 500 employs a dynamically tuned micro-stripline coupled resonator, which is synchronized to the VCO's tuning port for low phase-hit and better noise performance. The oscillator 500 is advantageous in that the distributed resonator function and ultra low phase noise performance is achieved without having to use an expensive high Q resonator network with a special tuning arrangement to cover wide tuning range. This oscillator is further advantageous in that it may be mass produced for frequencies in the 2-3.2 GHz range, as compared with other known oscillators in this frequency range, which are of interest for example for mobile telephones.

The voltage-controlled oscillator 500 may be advantageously constructed using the (surface mounting design) SMD technique, for instance, and is further facilitated thereby because a novel distributed resonator is provided that is relatively simple to produce. As shown in the FIG. 5, because of an edge coupled open strip 520 in the center of the coupled-line resonator structure a distributed coupling is achieved while maintaining a wide tuning range and higher Q factor. In accordance with a concomitant feature and aspect of the invention, the oscillator includes a housing enclosing the oscillator stage with the distributed resonator and passive components mounted using the SMD technique.

Figure 6:
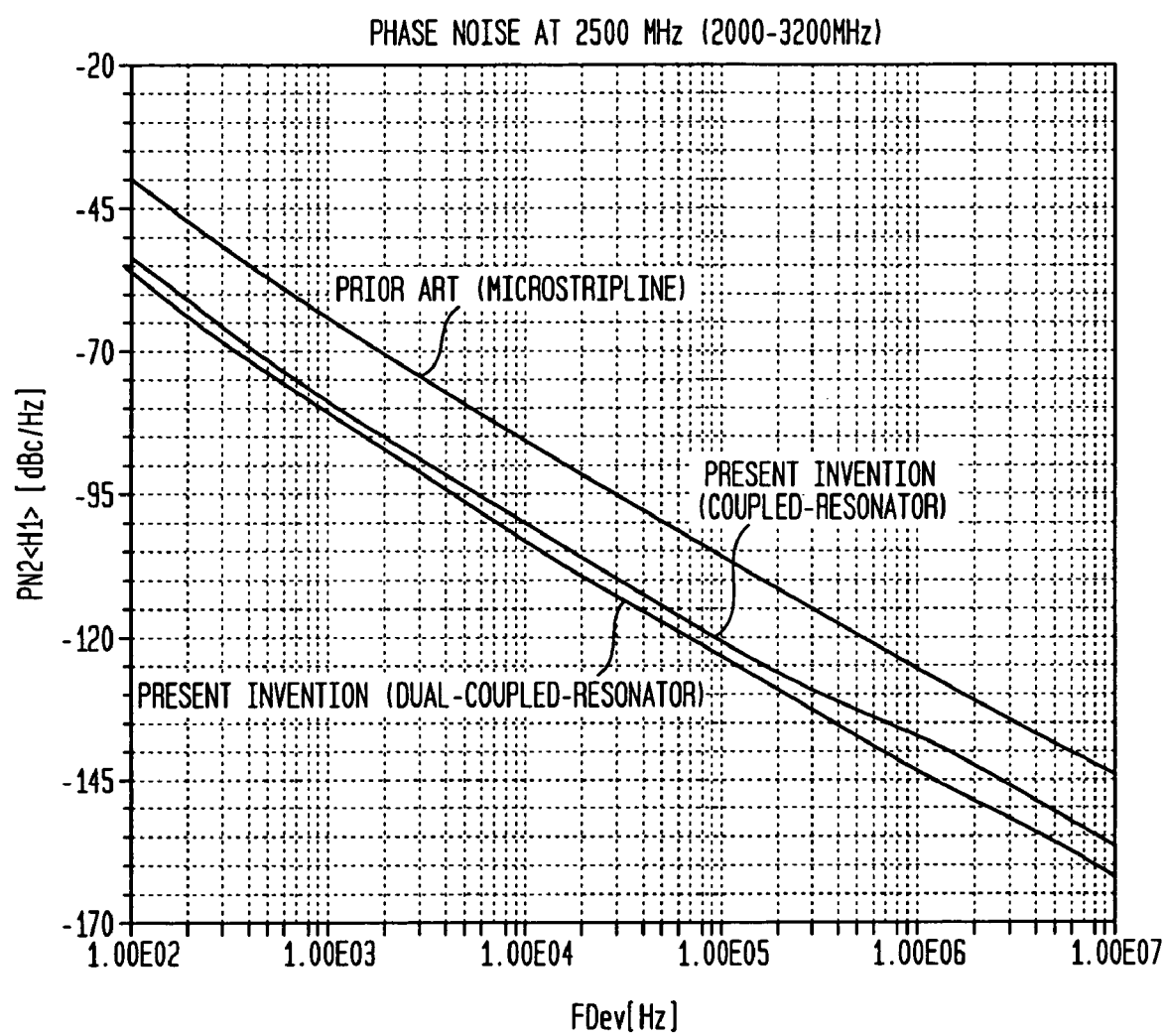
FIG. 6 illustratively depicts the phase noise plot of an oscillator in accordance with an aspect of the present invention.

Turning now to FIG. 6, there is shown a phase noise plot of two oscillators in accordance with an aspect of the present invention. The oscillators comprise oscillators of the type shown in FIGS. 2 and 3 (coupled resonator type) and FIGS. 4 and 5 (dual coupled resonator type). Each of the oscillators operate over a frequency band of 2-3.2 GHz. As shown in FIG. 6, the measured phase noise at a 10 KHz offset from the carrier frequency 2.5 GHz was approximately −108 dBc/Hz. In contrast, the measured phase noise of a prior art device was −80 dBc/Hz. Thus, the phase noise performance of an oscillator designed in accordance with this aspect of the present invention and based on the dynamically tuned coupled resonators networks is typically improved by more than 20 dB over prior art oscillators.

Figure 7:
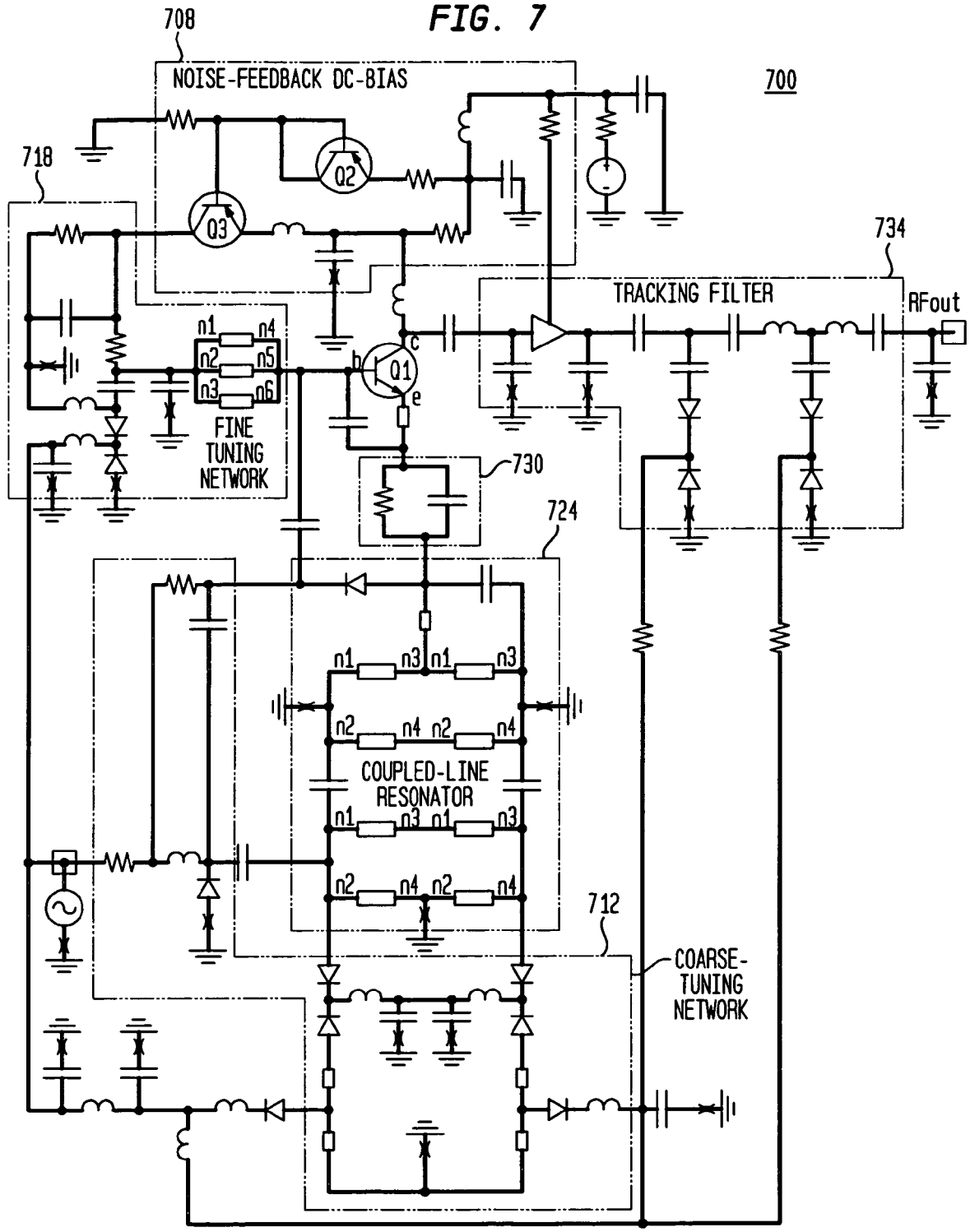
FIG. 7 is a schematic circuit diagram of a voltage controlled oscillator in accordance with an aspect of the present invention.

Turning now to FIG. 7, there is shown a schematic circuit diagram of an oscillator 700 in accordance with an additional aspect of the present invention. FIG. 7 illustrates a schematic of a hybrid tuned (coarse/fine) ultra low noise wideband oscillator 700 in accordance with a further aspect of the present invention. In accordance with this aspect of the present invention, the oscillator stage 700 includes a noise feedback DC-bias circuit 708, a coarse-tuning network 712, a fine-tuning network 718 and a dynamically tuned dual coupled resonator network 724. The feedback DC-bias circuit 708 is preferably incorporated with the oscillator's transistor Q1 (3-terminal active device) so that frequency stability may be achieved despite temperature fluctuations or fluctuations in the supply voltage. Other advantages result from the fact that it is not necessary to provide an active current source for the supply voltage. A low supply voltage is possible, which is an advantage in mobile communication systems, for example. In particular, the operating point of the oscillator transistor may be adjusted for a non-overdriven operating mode of the oscillator transistor. This is done by means of the feedback DC-bias circuit 708.

The oscillator further includes a noise filter 730 and a tracking filter 734. The noise filter is coupled to the emitter terminal of the transistor Q1. The tracking filter 734 is coupled to the collector terminal of the transistor Q1. The output signal of the oscillator is provided through the tracking filter 734.

In accordance with this aspect of the present invention, a design approach that facilitates coarse and fine-tuning, while maintaining ultra low noise performance over the tuning range (1200-3600 MHz) is provided. To overcome the loading problem, coarse and fine-tuning are incorporated at different nodes for better isolation and noise performance in a PLL application. Using a dynamically tuned resonator network that is incorporated with a tracking filter at the oscillator's output, the oscillator circuitry may be used for other user-definable frequency bands. Furthermore, to compensate for processing and temperature variations, a VCO coarse tuning (with high gain) makes the circuit more sensitive to coupling from nearby circuits and power supply noise. To overcome this problem, a fine-tuning network is incorporated at a node of the oscillator circuit, which needs less gain to cover temperature and supply variations that minimize the noise interference.

In an oscillator intended for fixed frequency operation, it is relatively easy to select the coupling parameter so that it gives optimum phase noise performance. However, for wideband tunability it is usually difficult to satisfy the optimum coupling factor over the tuning range. The usual approach is to select the spacing between the coupled lines, compromise the drive level and conduction angle that permit adequate (rather than optimum) oscillator operation over the desired tuning range. By doing so, however, optimum oscillator performance is achieved at only one frequency, if at all. Further, the use of fixed structure of micro-stripline necessarily limits the range of possible operating frequencies, sometime preventing certain design criteria from being met. An alternative approach is to try and design oscillator circuit so that the optimum dimension changes, as a function of frequency, in exactly the same manner and magnitude as the frequency control signal changes as a function of tuning voltage.

Figure 8:
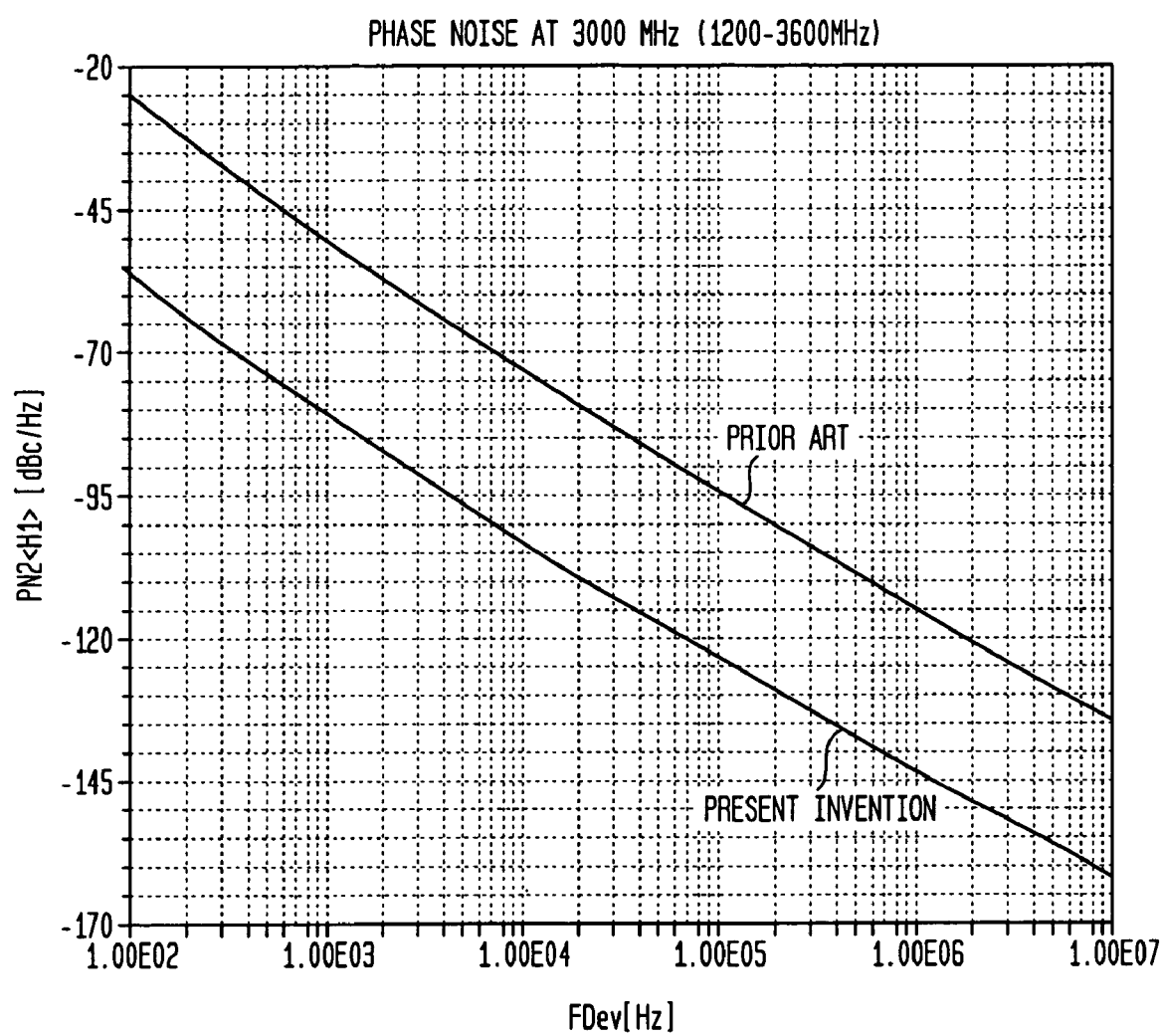
FIG. 8 illustratively depicts the phase noise plot of an oscillator in accordance with an aspect of the present invention.

The oscillator shown in the FIG. 7 facilitates coarse and fine-tuning, while maintaining ultra low noise performance over the tuning range (1200-3600 MHz) by incorporating a dynamically tuned filter and tuning network. Typically, the phase noise is −105 dBc/Hz @10 KHz offset for the 1200-3600 MHz frequency band. The circuit operates at 12 Volt and 25 mA, and gives power output of more than 8 dBm over the tuning range. The coarse tuning as for 1200-3600 MHz frequencies is from 0.5 to 28 Volts, and fine-tuning is 1-5 Volt (20-40 MHz/Volt). FIG. 8 shows the measured phase noise plot for a hybrid-tuned wideband (1200-3600 MHz) VCO at a frequency of 3000 MHz implemented in accordance with FIG. 7.

Figure 9:
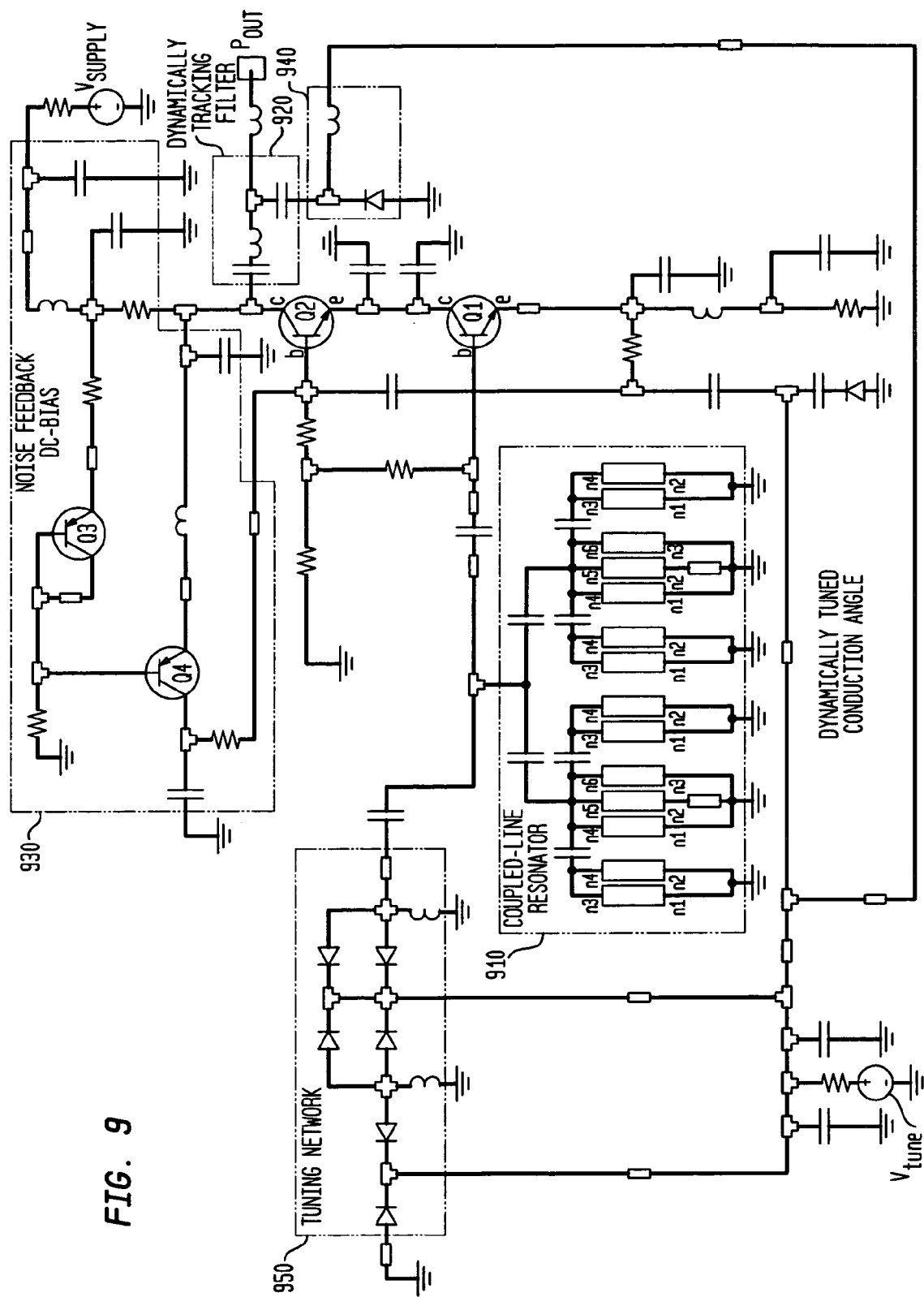
FIG. 9 is a schematic circuit diagram of a voltage controlled oscillator in accordance with an aspect of the present invention.

FIG. 9 depicts the schematic of the ultra low noise power efficient wideband (2000-3000 MHz) VCO 900 in accordance with an additional aspect of the present invention. In applications where the phase noise performance at lower offset from the carrier is important, the circuitry depicted in FIG. 9 supports ultra low noise performance over the tuning range. Ceramic and SAW resonator based oscillators are usually used as ultra low phase noise oscillators, but these high Q resonators are expensive and their availability and performance is limited to a select frequency and narrow operating temperature range. Accordingly, these oscillators are generally not considered suitable for operating in a stringent temperature environment nor for low cost applications. In addition, ceramic resonators are more susceptible to noise interference, and sensitive to phase-hits in PLL applications.

Micro-stripline coupled-resonators are depicted much like a transmission line in an equivalent circuit and can achieve similar performance as ceramic resonator. Micro-stripline resonators, however, are not without flaws, and are susceptible to noise interference, and exhibit a lower Q factor as compared to ceramic resonators. The Q factor of the resonator is typically considered a key factor for low phase noise performance. However, overall oscillator performance is controlled by the time average loaded Q of the oscillator circuit.

These disadvantages are generally overcome by means of a novel configuration of the planar coupled-resonators as is depicted in FIG. 9. Thus, in accordance with this aspect of the present invention, a cascode configuration of the negative resistance generating device is integrated with the resonator network to provide a better time average loaded Q for the oscillator circuit. As shown, the cascode configured device comprises a pair of bipolar transistors Q1, Q2 arranged in a common collector common emitter mode. The oscillator further includes a dual coupled micro-stripline resonator network 910, circuitry 920 for dynamically tuning the conduction angle of the cascode configure device, a noise feedback DC-bias network 930, a dynamic tracking filter 940 and a tuning network 950. The effective Q of the coupled resonator network 910 is improved by optimizing the rate of change of the phase over the tuning range by dynamically tuning the coupling parameter.

The oscillator topology of FIG. 9 improves the phase noise and thermal drift and also extends the operating frequency of the micro-stripline based resonator to higher frequency band depending upon the coupling network. The freedom of selection of the frequency, ultra low phase noise, wide tuning range, and stable over temperature will make this technology promising and attractive for next generation integrated high frequency mobile communication system. This aspect of the present invention offers an effective topology by incorporating two three terminal active devices (bipolar transistors) in a cascode configuration so that both devices share the same bias current. The circuit may be operated at 12 V and 15 mA and gives power output better than 3 dBm. Furthermore, the basic structure can be extended to other applications, which have similar kind of requirements.

Figure 10:
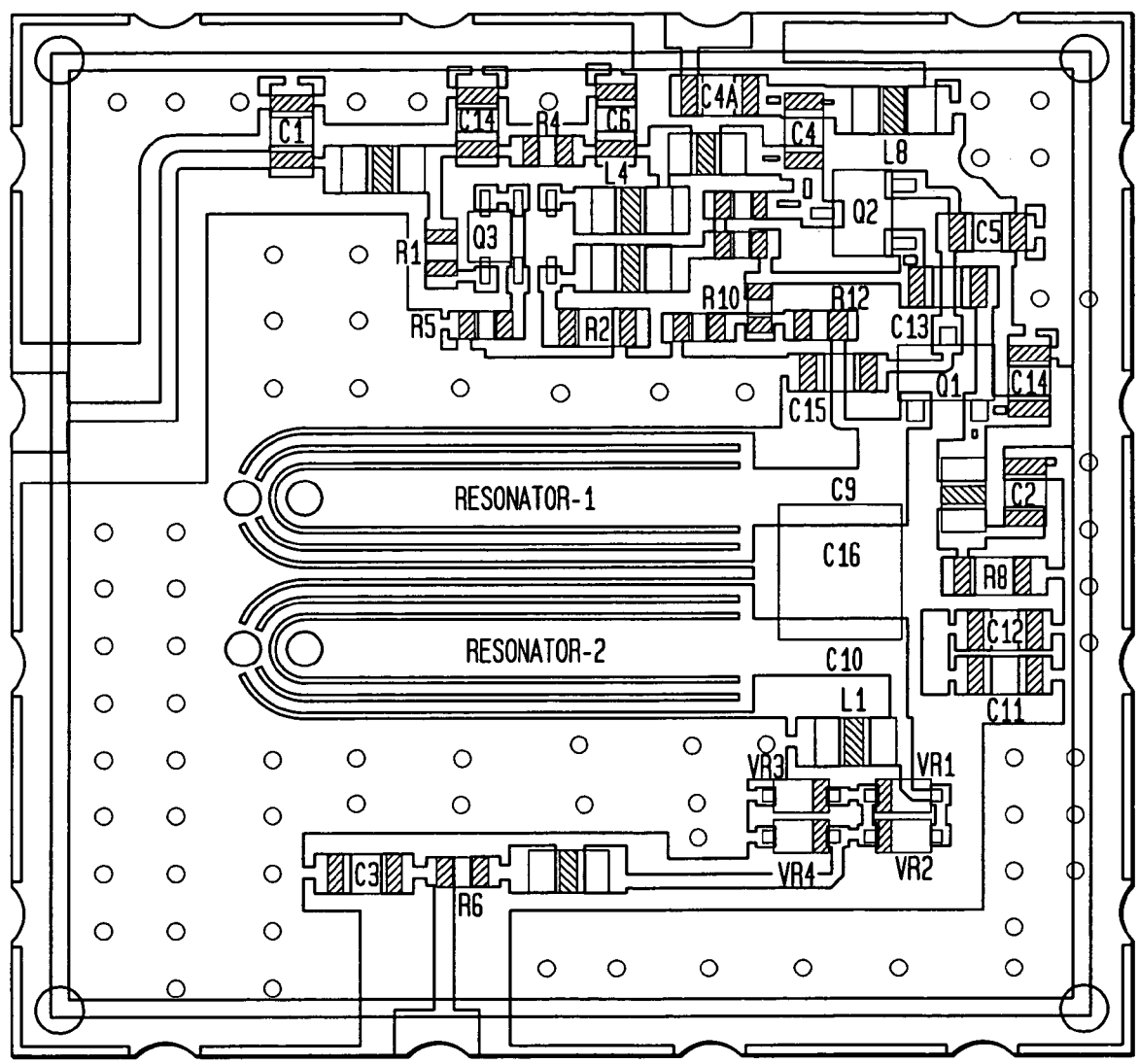
FIG. 10 illustrates the layout of a voltage controlled oscillator in accordance with an aspect of the present invention.
Figure 11:
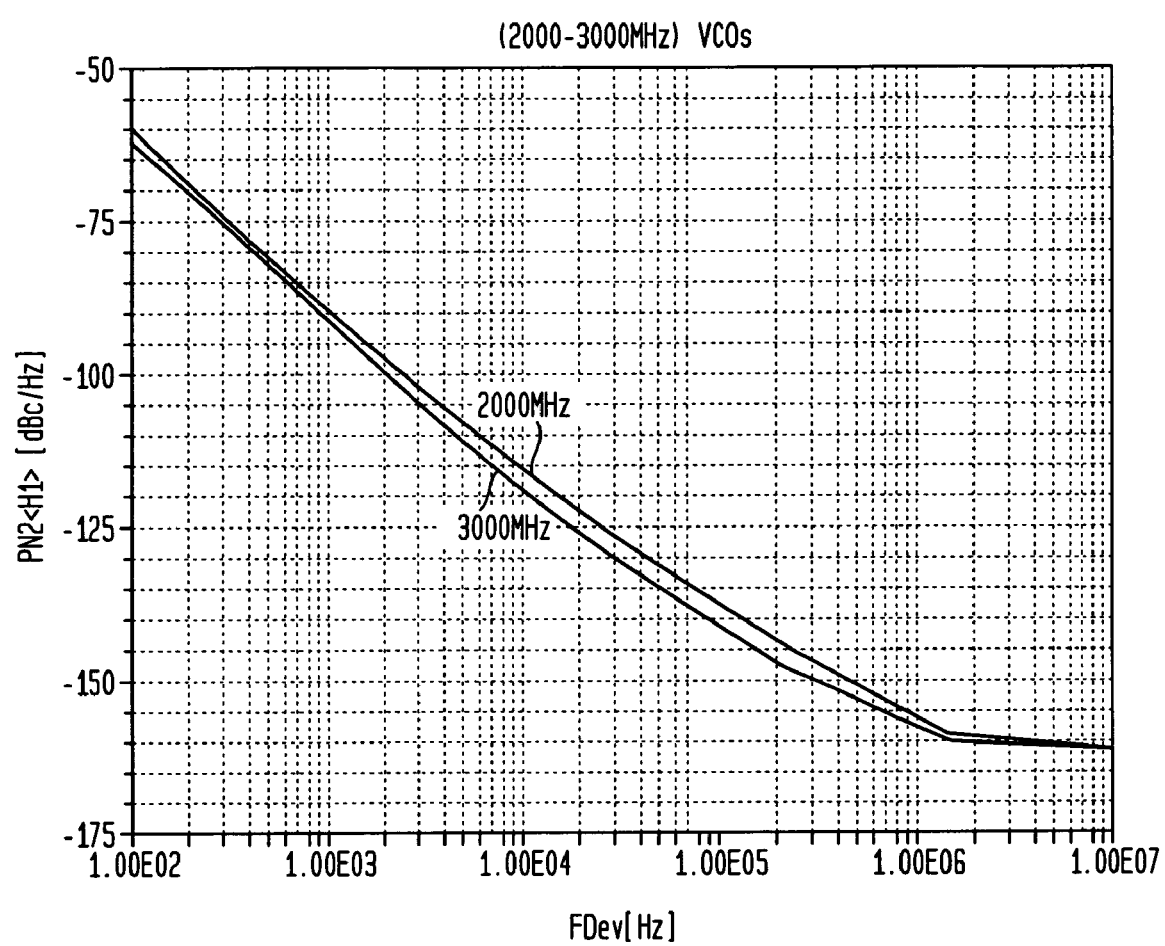
FIG. 11 illustratively depicts the phase noise plot of an oscillator in accordance with an aspect of the present invention.

FIG. 10 shows a possible schematic layout of the circuitry shown in FIG. 9. FIG. 11 shows the phase noise plot of the ultra low noise power efficient wideband (2000-3000 MHz) VCO A voltage-controlled oscillator implemented in accordance with the present invention may be employed in any number of devices that are used to communicate on data, telephone, cellular or, in general, communications network. Such devices may include but are not limited to, for example, cellular phones, personal digital assistants, modem cards, lap tops, satellite telephones. As a general matter, the oscillator circuitry shown in the various drawings and described above may be employed in a PLL to either generate a clock signal that may be used to transmit or recover information transmitted or received over a network. In addition to wireless networks, the circuitry of the present invention may be employed in wired networks, satellite networks, etc.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

We claim:

1. An oscillator, comprising:
an active device having first, second and third terminals;
a plurality of micro-stripline resonators coupled together to form a coupled-resonator network, the coupled-resonator network being coupled to the second terminal of the active device;
a tuning network coupled to the coupled-resonator network, the tuning network being operable to adjust the coupling between at least two of the resonators that form the coupled resonator network; and
circuitry connected across the tuning network and the coupled-resonator network, the circuitry being operable to adjust a conduction angle associated with the oscillation.

2. The oscillator of claim 1, wherein the circuitry is further operable to adjust the conduction angle of the active device as a tuning voltage associated with the tuning network is adjusted.

3. The oscillator of claim 1, wherein the tuning network is further operable to adjust a resonant frequency associated with the coupled-resonator network.

4. The oscillator of claim 1, wherein at least two of the plurality of micro-stripline resonators are inductively coupled together to form the coupled resonator network.

5. The oscillator of claim 1, wherein the oscillator is fabricated on a stripline board such that the micro-stripline resonators are disposed in a layer of the board.

6. The oscillator of claim 5, wherein the oscillator is fabricated on FR4 material.

7. The oscillator of claim 5, wherein the oscillator includes a multi-layer surface.

8. The oscillator of claim 1, wherein the coupled-resonator network includes a center strip as an open transmission line in the form of an etched structure having a wavelength that is shorter than the quarter-wavelength of the oscillator's operating frequency.

9. The oscillator of claim 8, wherein the coupled-resonator network includes a voltage-controlled variable-capacitance diode coupled to the second terminal of the active device.

10. The oscillator of claim 1, wherein the coupled-resonator network comprises an asymmetric coupled microstripline having stages that are disposed in a housing in a surface mounted device.

11. The oscillator of claim 1, wherein the active device comprises a pair of transistors in a cascode configuration such that the coupled-resonator network is coupled to the base of each transistor.

12. An oscillator, comprising:
a transistor having base, emitter and collector terminals;
a tuning network coupled to the base of the transistor, the tuning network being operable to tune the operating frequency of the oscillator over a frequency band;
a noise filter coupled to the emitter of the transistor and the tuning network;
a tracking filter coupled to the collector of the transistor and the tuning network; and
circuitry coupled to the base of the transistor and the tuning network for electronically tuning the conduction angle of the transistor as the operating frequency of the oscillator is tuned over the frequency band.

13. The oscillator of claim 12, wherein the conduction angle is adjusted by tuning the drive level of the transistor.

14. The oscillator of claim 12, wherein the transistor is selected from the group consisting of a bipolar transistor and a field effect transistor.

15. The oscillator of claim 12, further comprising a noise feedback and bias circuit coupled between the collector and base of the transistor for maintaining a voltage level appearing at the collector over the operating temperature range of the oscillator.

16. The oscillator of claim 12, wherein the tuning network comprises a first network for tuning the operating frequency over a first range and a second network for tuning the operating frequency within the first range.

17. A voltage controlled oscillator comprising:
a housing enclosing an oscillator stage having a coupled micro-stripline resonator and associated passive components mounted using surface mount design technology;
wherein the oscillation stage further includes an active device, a tuning network, and a circuitry coupled across the active device and the tuning network, configured to electronically tune the conduction angle of the active device.

18. The voltage controlled oscillator of claim 17, wherein the resonator comprises a surface mounted distributed planar resonator.

19. The voltage controlled oscillator of claim 18, wherein the distributed planar resonator comprises a multi-layer surface mounted in a ceramic medium.

20. The voltage controlled oscillator of claim 18, wherein the distributed planar resonator comprises a multi-layer surface mounted in FR4 media.

21. The voltage controlled oscillator of claim 18, wherein the distributed planar resonator comprises a multi-layer surface.

22. The voltage controlled oscillator of claim 17, wherein the micro-stripline resonator is formed by a stripline resonator that includes an air-cavity in a multi-layer board.

23. The voltage controlled oscillator of claim 17, wherein the micro-stripline resonator comprises an asymmetric micro-stripline resonator.

24. A telephone, comprising:
- a phase lock loop for generating a clock signal used to transmit or receive information communicated from or to the telephone,
- wherein the phase lock loop includes a voltage controlled oscillator comprising;
- a transistor having base, emitter and collector terminals;
- a tuning network coupled to the base of the transistor, the tuning network being operable to tune the operating frequency of the oscillator over a frequency band;
- a plurality of micro-stripline resonators coupled together to form a coupled-resonator network, the coupled-resonator network being coupled to the base of the transistor; and
- circuitry coupled across the transistor and the tuning network for electronically tuning the conduction angle of the transistor as the operating frequency of the oscillator is tuned over the frequency band.

25. The telephone of claim 24, further comprising a noise filter coupled to the emitter of the transistor and the tuning network.

26. The telephone of claim 24, further comprising a tracking filter coupled to the collector of the transistor and the tuning network.

27. The telephone of claim 24, wherein the resonator comprises a surface mounted planar resonator.

28. The telephone of claim 27, wherein the planar resonator comprises a multi-layer surface mounted in a medium selected from the group consisting of FR4 and ceramic media.

* * * * *